(12) United States Patent
Hatakeyama et al.

(10) Patent No.: US 7,745,104 B2
(45) Date of Patent: Jun. 29, 2010

(54) BOTTOM RESIST LAYER COMPOSITION AND PATTERNING PROCESS USING THE SAME

(75) Inventors: Jun Hatakeyama, Niigata (JP); Toshihiko Fujii, Niigata (JP); Takanobu Takeda, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 267 days.

(21) Appl. No.: 11/822,805

(22) Filed: Jul. 10, 2007

(65) Prior Publication Data

US 2008/0038662 A1 Feb. 14, 2008

(30) Foreign Application Priority Data

Aug. 10, 2006 (JP) ............................. 2006-218656

(51) Int. Cl.
G03F 7/095 (2006.01)
G03F 7/40 (2006.01)
G03F 7/038 (2006.01)

(52) U.S. Cl. .................... 430/323; 430/271.1; 430/313; 430/272.1; 576/281; 576/284; 525/161; 525/176; 216/47

(58) Field of Classification Search ........................ None
See application file for complete search history.

(56) References Cited

U.S. PATENT DOCUMENTS 6,013,413 A * 1/2000 Frechet et al. ........... 430/270.1

(Continued)

FOREIGN PATENT DOCUMENTS

| JP | A 06-118651 | 4/1994 |
| JP | A 09-110938 | 4/1997 |
| JP | A 10-324748 | 12/1998 |

(Continued)

OTHER PUBLICATIONS

English translation of JP, 2004-205658, A ( 2004) from machine translation from AIPN Japan Patent Office National Center for Industrial Property Information and Training, generated Jul. 19, 2009, 36 pages.*

(Continued)

*Primary Examiner*—Cynthia Hamilton
(74) *Attorney, Agent, or Firm*—Oliff & Berridge, PLC

(57) ABSTRACT

There is disclosed a bottom resist layer composition for a multilayer-resist film used in lithography comprising, at least, a polymer comprising a repeating unit represented by the following general formula (1). Thereby, there can be provided a bottom resist layer composition that exhibits optimum n value and k value on exposure to shorter wavelengths, excellent etching resistance under conditions for etching substrates, and is promising for forming a bottom resist layer used for a multilayer-resist process such as a silicon-containing bilayer resist process or a trilayer resist process using a silicon-containing intermediate resist layer.

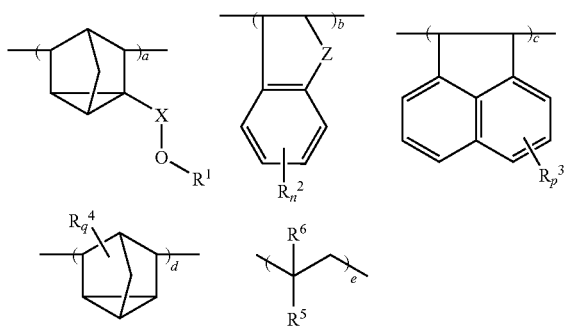

(1)

10 Claims, 7 Drawing Sheets

U.S. PATENT DOCUMENTS

| | | | |
|---|---|---|---|
| 6,420,088 | B1 | 7/2002 | Angelopoulos et al. |
| 6,506,497 | B1 | 1/2003 | Kennedy et al. |
| 7,510,820 | B2* | 3/2009 | Hatakeyama et al. ........ 430/323 |
| 2005/0037289 | A1* | 2/2005 | Carr et al. .................... 430/311 |
| 2007/0122736 | A1* | 5/2007 | Hatakeyama et al. .... 430/270.1 |
| 2007/0122740 | A1* | 5/2007 | Hatakeyama et al. .... 430/270.1 |

FOREIGN PATENT DOCUMENTS

| | | |
|---|---|---|
| JP | A 11-302382 | 11/1999 |
| JP | A 2000-294504 | 10/2000 |
| JP | A 2001-040293 | 2/2001 |
| JP | A 2002-014474 | 1/2002 |
| JP | A 2002-055456 | 2/2002 |
| JP | A 2002-214777 | 7/2002 |
| JP | A 2004-205658 | 7/2004 |

OTHER PUBLICATIONS

Morrison et al, Organic Chemistry, Third Edition, Allyn And Bacon, Inc, Boston, Ma, 1977 Cover page and pp. 675-681.*

Hatakeyama, et al; (1998); "Investigation of Discrimination Enhancement in Polysilsesquioxane Based Positive Resist for ArF Lithography"; SPIE; vol. 3333; pp. 62-72.

Brunsvold, et al; (1993); "Evaluation of a Deep UV Bilayer Resist for Sub-Half Micron Lithography"; SPIE; vol. 1925; pp. 377-387.

Lynch, et al; (1994); "Properties and Performance of Near UV Reflectivity Control Layers"; SPIE; vol. 2195; pp. 225-229.

Schaedeli, et al; (1996); "Evaluation of Materials for 193-nm Lithography"; Journal of Photopolymer Science and Technology; vol. 9; No. 3; pp. 435-446.

Kwong, et; (2001); "IBM 193nm Bilayer Resist: Materials, Lithographic Performance and Optimization"; Advances in Resist Technology and Processing XVII; Proceedings of SPIE; vol. 4345; pp. 50-57.

Moran, et al; (1979); "High resolution, steep profile resist patterns"; J. Vac. Sci. Technol.; vol. 16; pp. 1620-1624.

Abe, et al; (2005); "Sub-55-nm Etch Process Using Stacked-Mask Process"; Dry Process International Symposium; pp. 11-12.

Peters, et al; (2005); "A Novel Contact Hole Shrink Process for the 65-nm-node and Beyond"; Advances in Resist Technology and Processing XVII; Proceedings of SPIE; vol. 5753; pp. 195-205.

* cited by examiner (A)

(B)

(C)

(D)

(E)

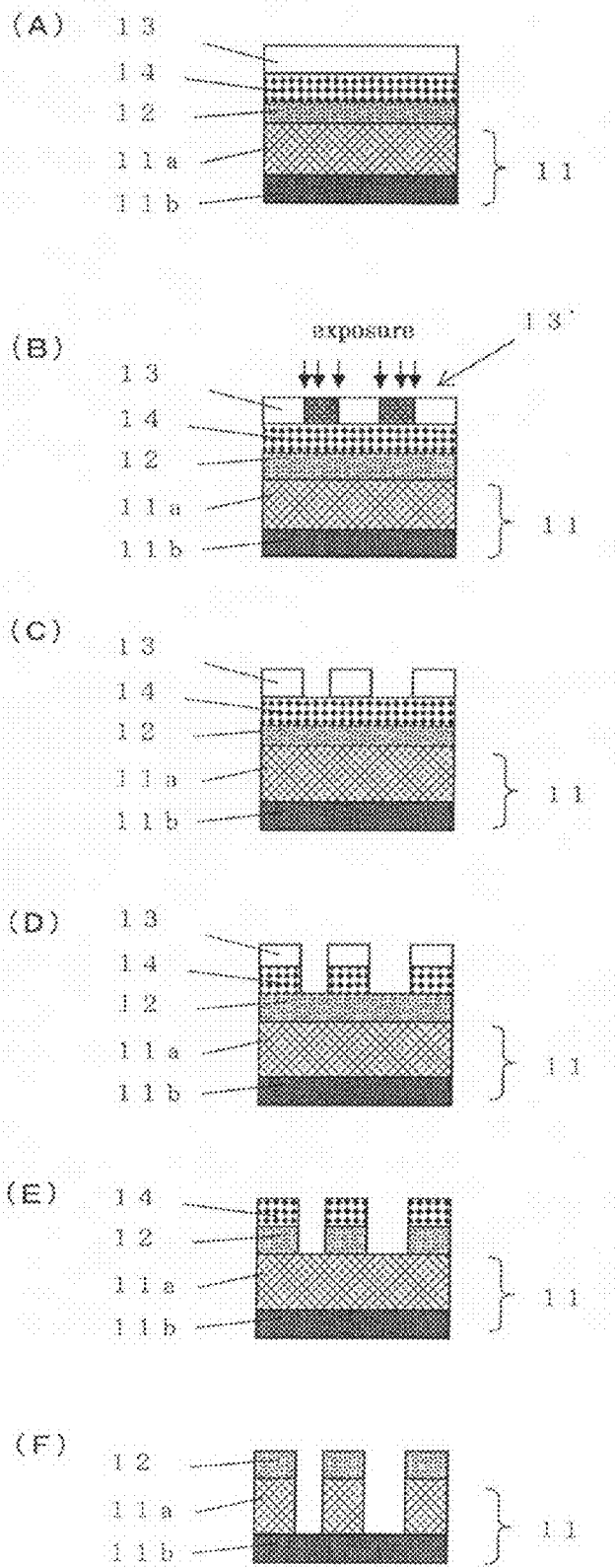

BOTTOM RESIST LAYER COMPOSITION AND PATTERNING PROCESS USING THE SAME

BACKGROUND OF THE INVENTION

1. Field of the Invention

The present invention relates to a bottom resist layer composition that serves as an antireflective coating composition and used for micro processing in manufacturing processes of semiconductor devices and so on. The present invention particularly relates to a bottom resist layer composition of a multilayer-resist film suitable for exposure using far ultraviolet ray, KrF excimer laser light (248 nm), ArF excimer laser light (193 nm), $F_2$ laser light (157 nm), $Kr_2$ laser light (146 nm), $Ar_2$ laser light (126 nm), soft x-ray (EUV, 13.5 nm), electron beam (EB), or the like. Furthermore, the present invention relates to a process for patterning a substrate by lithography using the bottom resist layer composition.

2. Description of the Related Art

As packing density and speed of LSIs have become higher in recent years, a finer pattern rule has been demanded. In lithography using optical exposure which is used as a general technique at present, resolution is reaching the inherent limit defined by a wavelength of a light source.

Optical exposure has been widely used using g-line (436 nm) or i-line (365 nm) of a mercury-vapor lamp as a light source for lithography when a resist pattern is formed. It has been considered that a method of using an exposure light with a shorter wavelength is effective as a means for achieving a further finer pattern. For this reason, KrF excimer laser with a shorter wavelength of 248 nm has been used as an exposure light source instead of i-line (365 nm), for mass-production process of a 64 M bit DRAM processing method. However, a light source with far shorter wavelength is needed for manufacture of DRAM with a packing density of 1 G or more which needs a still finer processing technique (a processing dimension of 0.13 μm or less), and lithography using ArF excimer laser (193 nm) has been particularly examined.

On the other hand, it has been known so far that a bilayer-resist process is excellent for forming a pattern with a high aspect ratio on a nonplanar substrate. Furthermore, in order to develop a bilayer resist film with common alkaline developers, a high-molecular silicone compound having a hydrophilic group such as a hydroxy group or a carboxyl group is necessary as a base resin of a top resist layer composition.

As a silicone chemically amplified positive-resist composition, proposed is a silicone chemically amplified positive-resist composition for KrF excimer laser in which polyhydroxy benzyl silsesquioxane, which is a stable alkali-soluble silicone polymer, in which some phenolic hydroxyl groups are protected by t-Boc groups is used as a base resin, and the base resin is combined with an acid generator (see Japanese Patent Application Laid-open (KOKAI) No. 06-118651 and SPIE vol. 1925 (1993) p377). Moreover, as the silicone resist composition for ArF excimer laser, proposed is a silsesquioxane-based positive resist composition in which cyclohexyl carboxylic acids are substituted with acid labile groups (see Japanese Patent Application Laid-open (KOKAI) No. 10-324748; Japanese Patent Application Laid-open (KOKAI) No. 11-302382; and SPIE vol. 3333 (1998) p62). Furthermore, as the silicone resist composition for $F_2$ laser, proposed is a silsesquioxane-based positive resist composition having hexafluoro isopropanols as soluble groups (see Japanese Patent Application Laid-open (KOKAI) No. 2002-55456). The above-mentioned polymers include in their main chains poly silsesquioxane containing a ladder structure formed by condensation polymerization of a trialkoxy silane or a tri halogenated silane.

As a resist base polymer having silicon-pendant side chains, silicon-containing (meth)acrylate polymers are proposed (see Japanese Patent Application Laid-open (KOKAI) No. 09-110938 and J. Photopolymer Sci. and Technol. Vol. 9 No. 3 (1996) p435-446).

A bottom layer used for a bilayer-resist process is required a hydrocarbon compound which can be etched with changed.

It follows from FIG. 3 that a sufficient antireflection effect to reduce reflectivity of a substrate to 1% or less is obtained by making an intermediate resist layer to have a low k value of 0.2 or less and a proper thickness.

In general, an antireflective coating with a thickness of 100 nm or less is required to have a k value of 0.2 or more in order to reduce the reflectivity of a substrate to 1% or less (see FIG. 2). However, an intermediate resist layer of a trilayer structure has an optimum k value of 0.2 or less because a bottom resist layer can reduce reflection to some extent.

Next, FIG. 4 and FIG. 5 show fluctuations of reflectivity of a substrate while the thickness of an intermediate resist layer and the thickness of a bottom resist layer are changed in the case that a bottom resist layer has a k value of 0.2 or 0.6.

The bottom resist layer having a k value of 0.2 in FIG. 4 is intended to represent a bottom resist layer optimized for the bilayer process. The bottom resist layer having a k value of 0.6 in FIG. 5 has the k value similar to those of novolac or polyhydroxy styrene at a wavelength of 193 nm.

The thickness of a bottom resist layer fluctuates depending on topography of a substrate. On the other hand, the thickness of an intermediate resist layer is oxygen gas. The bottom layer is required to have high etching resistance because the layer functions as a mask in the case of etching its underlying substrate. When the bottom layer is etched with oxygen gas, the layer is required to consist of only hydrocarbons without silicon atoms. Moreover, in order to improve a line width controllability of a silicon-containing top resist layer and to reduce irregularities on pattern sidewalls and pattern collapse caused by standing waves, the bottom resist layer is also required to function as an antireflective coating, specifically to reduce reflectivity from the bottom resist layer to the top resist layer down to 1% or less.

Then results of calculating fluctuations of reflectivity of a substrate while a thickness of a bottom resist layer is changed in the range of 0 to 500 nm are shown in FIG. 1 and FIG. 2. It is premised that an exposure wavelength is 193 nm, n value of a top resist layer is 1.74 and k value thereof is 0.02. FIG. 1 shows fluctuations of reflectivity of a substrate while k value of a bottom resist layer is fixed at 0.3, n value is changed in the range of 1.0 to 2.0 in the ordinate axis, and a thickness of a bottom resist layer is changed in the range of 0 to 500 nm in the abscissa axis. In the case of assuming a bottom resist layer with a thickness of 300 nm or more for a bilayer resist process, optimum values that realize reflectivity of 1% or less exist in the range of 1.6 to 1.9 which is as much as or a little higher than that of a top resist layer.

FIG. 2 shows fluctuations of reflectivity of a substrate while n value of a bottom resist layer is fixed at 1.5, and k value thereof is changed in the range of 0 to 0.8. Reflectivity of 1% or less is realized when k value is in the range of 0.24 to 0.15. Meanwhile, an optimum k value of an antireflective coating used with a thin thickness of about 40 nm for a monolayer resist process is 0.4 to 0.5, which is different from an optimum k value of a bottom resist layer used with a thickness of 300 nm or more for a bilayer resist process.

Therefore, it is shown that a bottom resist layer for a bilayer resist process is required to have lower k value, namely, higher transparency.

Then as a bottom resist layer composition for a wavelength of 193 nm, a copolymer of a polyhydroxy styrene and an acrylate has been examined as disclosed in SPIE Vol. 4345 (2001) p50. Polyhydroxy styrene has an extremely strong absorption at a wavelength of 193 nm. Polyhydroxy styrene alone has a high k value of about 0.6. Then the k value is adjusted to about 0.25 by carrying out copolymerization with an acrylate whose k value is almost 0.

However, acrylates exhibit lower etching resistance than polyhydroxystyrene during etching of a substrate. Moreover, in order to lower the k value, acrylates have to be copolymerized so that the acrylates account for considerable ratio. As a result, etching resistance during etching of a substrate is significantly lowered. The etching resistance influences not only an etch rate but also generation of surface roughness after etching. The copolymerization of acrylates cause serious increase of surface roughness after etching.

One of moieties that are more transparent at a wavelength of 193 nm and higher etching resistance than a benzene ring is a naphthalene ring. For example, Japanese Patent Application Laid-open (KOKAI) No. 2002-14474 discloses a bottom resist layer comprising a naphthalene ring or an anthracene ring. However, a naphthol copolycondensation novolac resin and a polyvinyl naphthalene resin have k values in the range of 0.3 to 0.4. These k values do not reach the target transparency of 0.1 to 0.3, and thus transparency of the resins have to be increased. In addition, the naphthol copolycondensation novolac resin and the polyvinyl naphthalene resin have low n values at a wavelength of 193 nm. According to measurement results of the present inventors, the naphthol copolycondensation novolac resin has an n value of 1.4, and the polyvinyl naphthalene resin has such a low n value of 1.2. Acenaphthylene polymers disclosed in Japanese Patent Application Laid-open (KOKAI) No. 2001-40293 and Japanese Patent Application Laid-open (KOKAI) No. 2002-214777 also have lower n values at a wavelength of 193 nm than those at a wavelength of 248 nm, high k values, and thus neither n value nor k value reaches the target value.

Meanwhile, a trilayer resist process is proposed. In the trilayer resist process, there are stacked a single layer resist without silicon as a top resist layer; under the top resist layer, an intermediate resist layer containing silicon atoms; and under the intermediate resist layer, an organic layer as a bottom resist layer (for example, see J. Vac. Sci. Technol., 16(6), November/December 1979).

In general, a single layer resist is superior in resolution to a silicon-containing resist. Therefore, a single layer resist exhibiting high resolution may be used as an exposure imaging layer in the trilayer resist process.

As the intermediate resist layer, Spin On Glass (SOG) films are used. Many SOG films have been proposed.

An optimum optical constant of a bottom layer to reduce reflection from a substrate in a trilayer resist process is different from that in a bilayer resist process.

The purpose to suppress reflection from a substrate as much as possible, specifically, to suppress a reflectivity of a substrate to 1% or less is the same in both a bilayer process and a trilayer process. However, antireflection effect is given only to a bottom layer in the bilayer process, while the antireflection effect may be given to either an intermediate layer or a bottom layer, or to both of them in the trilayer process.

U.S. Pat. No. 6,506,497 specification and U.S. Pat. No. 6,420,088 specification disclose a silicon-containing layer composition having antireflection effect.

In general, multi-layer antireflective coatings have higher antireflection effect than single layer antireflective coatings. Therefore, the multi-layer antireflective coatings have been widely and industrially used as antireflective coatings for optical materials.

High antireflection effect may be obtained by imparting antireflection effect to both an intermediate resist layer and a bottom resist layer.

When a silicon-containing intermediate resist layer functions as an antireflective coating in the trilayer process, a bottom resist layer is not particularly required to have a superlative function as an antireflective coating.

A bottom resist layer in the trilayer process is required to have high etching resistance during processing of a substrate rather than effects as an antireflective coating.

Therefore, novolac resins have been used as bottom resist layers for the trilayer process because novolac resins have high etching resistance and large amounts of aromatic groups.

Next, FIG. 3 shows fluctuations of reflectivity of a substrate while k value of an intermediate resist layer is wavelengths, excellent etching resistance under conditions of etching substrates, and is promising for forming a bottom resist layer used for a multilayer-resist process such as a silicon-containing bilayer resist process or a trilayer resist process using a silicon-containing intermediate layer.

In order to achieve the above mentioned object, the present invention provides a bottom resist layer composition for a multilayer-resist film used in lithography comprising, at least, a polymer comprising a repeating unit represented by the following general formula (1),

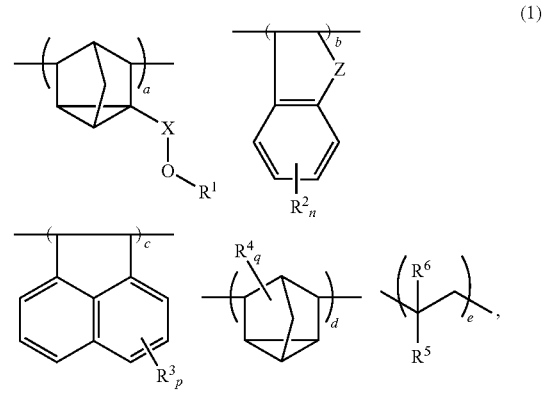

wherein $R^1$ represents a hydrogen atom or an acid labile group;

X represents any one of a single bond, —Y—C(=O)—, and a linear or branched alkylene group having 1-4 carbon atoms;

Y represents a single bond or a linear or branched alkylene group having 1-4 carbon atoms;

Z represents any one of a methylene group, an oxygen atom, and a sulfur atom;

$R^2$ and $R^3$ independently represent an alkyl group, an considered to hardly fluctuate and that the intermediate layer can be applied with a prescribed thickness.

It follows from FIGS. 4 and 5 that the reflectivity of a substrate can be reduced to 1% or less with a thinner thickness in the case of a bottom resist layer with a higher k value (k=0.6).

In the case of a bottom resist layer with a k value of 0.2 and with a thickness of 250 nm, an intermediate resist layer is required to be thick in order to achieve the reflectivity of 1%.

Increase of the thickness of an intermediate resist layer results in large load to a topmost resist layer during dry etching for processing the intermediate resist layer, and which is not preferable.

In recent years, finer patterns have been rapidly realized. In the dimension of 45 nm LS, resists having a thickness less than 100 nm are used in view of preventing pattern collapse. Also in the trilayer process, it has become difficult to transfer resist patterns having a thickness equal to or less than 100 nm to a silicon-containing intermediate resist layer. Therefore, thinner silicon-containing intermediate resist layers have increasingly used. It follows from FIGS. 4 and 5 that use of a silicon-containing intermediate resist layer having an absorption of a k value about 0.1 achieves the reflectivity of 1% or less independent of k value of a bottom resist layer, for example, when the silicon-$0 \leq d \leq 0.9$, $0 \leq e \leq 0.9$, and $0 < b+c+d+e < 1.0$.

As mentioned above, the bottom resist layer composition comprising a polymer comprising a repeating unit represented by the general formula (1) exhibits optimum n value and k value on exposure to short wavelengths such as 193 nm, and excellent etching resistance under conditions of etching substrates. Therefore, such a bottom resist layer composition is useful for forming a bottom resist layer used for a multilayer-resist process such as a silicon-containing bilayer resist process or a trilayer resist process using a silicon-containing intermediate resist layer.

Then a bottom resist layer formed with the bottom resist layer composition can be more transparent than layers formed with polyhydroxystyrene, cresol novolac, naphthol novolac, or the like. In addition, the bottom resist layer with a thickness of 200 nm or more exhibits excellent antireflection effects on exposure at short wavelengths such as 193 nm.

"Waviness" of a bottom resist layer pattern after a substrate is etched has been pointed out. A phenomenon is reported that hydrogen atoms of a bottom resist layer are substituted with fluorine atoms during etching of a substrate with a fluorocarbon gas (Proc. of Symp. Dry. Process, (2005) p11). It is considered that finer pattern waviness is caused because the surface of a bottom resist layer is turned into Teflon (registered trade mark) and containing intermediate resist layer has a thickness of 50 nm. However, there is a demand of using silicon-containing intermediate resist layers having a thickness equal to or less than 50 nm in view of enhancing accuracy of etching the silicon-containing intermediate resist layers. Silicon-containing intermediate resist layers with a thickness of 50 nm or less exhibit antireflection effects about half of the intermediate resist layers with a thickness more than 50 nm. Therefore, bottom resist layers underlaying such intermediate resist layers are required to have n values and k values similar to those of the bottom resist layers for a bilayer resist process.

Against this backdrop, there has been expected to develop a composition for forming a bottom resist layer that exhibits optimum n value and k value on exposure to shorter wavelengths, excellent etching resistance under conditions of etching substrates, and is promising for forming a bottom resist layer used for a multilayer-resist process such as a silicon-containing bilayer resist process or a trilayer resist process using a silicon-containing intermediate resist layer.

SUMMARY OF THE INVENTION

The present invention has been made in order to solve such problems. An object of the present invention is to provide a bottom resist layer composition that exhibits optimum n value and k value on exposure to shorter alkoxy group, an acetoxy group or an alkoxycarbonyl group each having 1-4 carbon atoms, or an aryl group having 6-10 carbon atoms;

$R^4$ represents an alkyl group having 1-4 carbon atoms or an aryl group having 6-10 carbon atoms;

$R^5$ represents a phenyl group or a condensed polycyclic hydrocarbon group having 10-30 carbon atoms in which hydrogen atoms in part or in entirety may optionally be substituted with a halogen;

n represents an integer of 0 to 4;

p and q independently represent an integer of 0 to 6;

$R^6$ represents a hydrogen atom or a methyl group; and a, b, c, d, and e satisfy $0 < a < 1.0$, $0 \leq b \leq 0.9$, $0 \leq c \leq 0.9$, $0 \leq d \leq 0.9$, $0 \leq e \leq 0.9$, and $0 < b+c+d+e < 1.0$.

The bottom resist layer composition comprising a polymer comprising a repeating unit represented by the general formula (1) exhibits optimum n value and k value on exposure to shorter wavelengths, excellent etching resistance under conditions of etching substrates, and is promising for forming a bottom resist layer used for a multilayer-resist process such as a silicon-containing bilayer resist process or a trilayer resist process using a silicon-containing intermediate resist layer.

In addition, the bottom resist layer composition preferably further comprises any one or more of an organic solvent, an acid generator, and a crosslinker.

As mentioned above, the bottom resist layer composition according to the present invention further comprises any one or more of an organic solvent, an acid generator, and a crosslinker, whereby it is possible to enhance application property of the composition to a substrate or the like, or to promote crosslinking reaction in a bottom resist layer by baking the composition or the like after the composition is applied to a substrate or the like. Therefore, a bottom resist layer formed with the composition has a uniform thickness; has less possibility of intermixing with a top resist layer or an intermediate resist layer; and cause less diffusion of low molecular components to the top resist layer or the like.

Furthermore, the present invention provides a patterning process for patterning a substrate by lithography wherein, at least, a bottom resist layer is formed on a substrate with the bottom resist layer composition according to the present invention; a top resist layer is formed on the bottom resist layer with a top resist layer composition of a photoresist composition, to form a bilayer resist film; a pattern circuit area of the top resist layer is exposed and then developed with a developer to form a resist pattern on the top resist layer; the bottom resist layer is etched using as a mask the top resist layer on which the pattern is formed; and then the substrate is etched using as a mask at least the bottom resist layer on which the pattern is formed, to form the pattern on the substrate.

As mentioned above, a bottom resist layer formed with the bottom resist layer composition according to the present invention exhibits optimum n value and k value on exposure to shorter wavelengths, and excellent etching resistance under conditions of etching substrates. Therefore, use of the bottom resist layer composition according to the present invention makes it possible to pattern a substrate accurately.

In this case, it is preferable that the top resist layer composition of a photoresist composition comprises a polymer containing silicon atoms, and the etching of the bottom resist layer using the top resist layer as a mask is carried out by using an etching gas mainly containing oxygen gas or hydrogen gas.

A bottom layer formed with the bottom resist layer composition according to the present invention is suitable for the patterning process in which the top resist layer composition comprises a polymer containing silicon atoms as a base resin, and the etching of the bottom resist layer using the top resist layer as a mask is carried out by dry etching using an etching gas mainly containing oxygen gas or hydrogen gas, thereby transferring the resist pattern on the top resist layer to the bottom resist layer. Therefore, use of the bottom resist layer composition according to the present invention makes it possible to pattern a substrate accurately.

In addition, the present invention provides a patterning process for patterning a substrate by lithography wherein, at least, a bottom resist layer is formed on a substrate with the bottom resist layer composition according to the present invention; an intermediate resist layer is formed on the bottom resist layer by using an intermediate resist layer composition containing silicon atoms; a top resist layer is formed on the intermediate resist layer by using a top resist layer composition of a photoresist composition, to form a trilayer resist film; a pattern circuit area of the top resist layer is exposed and then developed with a developer to form a resist pattern on the top resist layer; the intermediate resist layer is etched using as a mask the top resist layer on which the pattern is formed; the bottom resist layer is etched using as a mask at least the intermediate resist layer on which the pattern is formed; and then the substrate is etched using as a mask at least the bottom resist layer on which the pattern is formed, to form the pattern on the substrate.

As mentioned above, a bottom resist layer formed with the bottom resist layer composition according to the present invention exhibits optimum n value and k value on exposure to shorter wavelengths, and provides excellent antireflection effects optionally in combination with an intermediate resist layer having antireflection effects. In addition, the bottom resist layer has excellent etching resistance on etching a substrate. Therefore, use of the bottom resist layer for a trilayer resist process makes it possible to pattern a substrate more accurately.

In this case, it is preferable that the top resist layer composition of a photoresist composition comprises a polymer without a silicon atom, and the etching of the bottom resist layer using the intermediate resist layer as a mask is carried out by using an etching gas mainly containing oxygen gas or hydrogen gas.

A top resist layer comprising a polymer without a silicon atom has an advantage of exhibiting higher resolution than a top resist layer comprising a polymer containing a silicon atom. Therefore, the pattern transferred to the intermediate resist layer and the pattern transferred to the bottom resist layer by dry etching using an etching gas mainly containing oxygen gas or hydrogen gas and using the intermediate resist layer as a mask become accurate. Therefore, the substrate is etched by using the pattern-transferred bottom resist layer as a mask to pattern the substrate, whereby the substrate is patterned more accurately.

As mentioned above, the bottom resist layer composition according to the present invention exhibits optimum n value and k value on exposure to short wavelengths, excellent etching resistance, and is promising for forming a bottom resist layer used for a multilayer-resist process such as a silicon-containing bilayer resist process or a trilayer resist process using a silicon-containing intermediate resist layer.

BRIEF DESCRIPTION OF THE DRAWINGS

FIG. 7 is an explanatory view of a trilayer resist process.

DESCRIPTION OF THE INVENTION AND A PREFERRED EMBODIMENT

Figure 1:
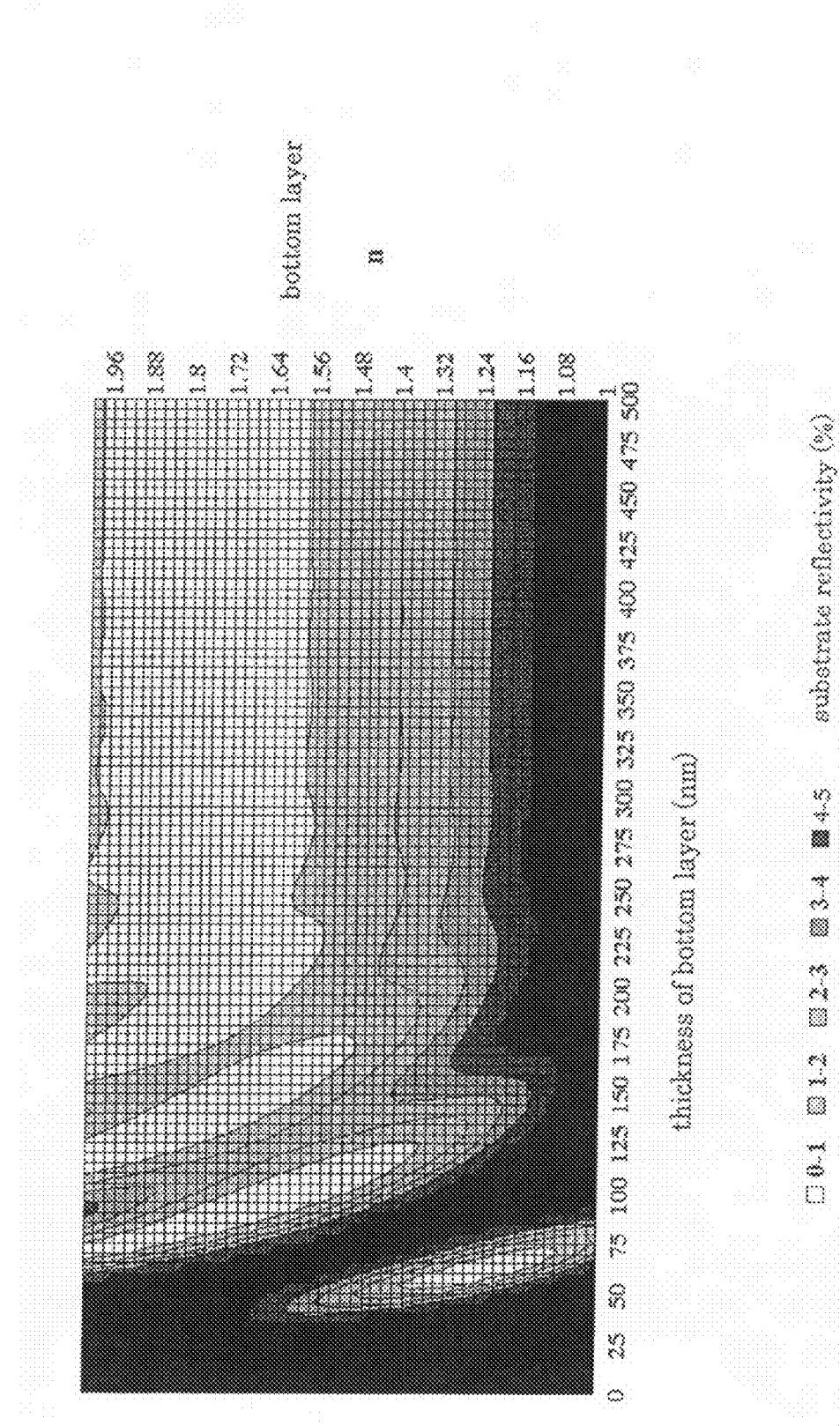
FIG. 1 is a graph showing the relation between the thickness of a bottom resist layer and reflectivity of a substrate in a bilayer-resist process where the refractive index k value of the bottom resist layer is fixed at 0.3, and the refractive index n value of the bottom resist layer is changed in the range of 1.0 to 2.0.
Figure 2:
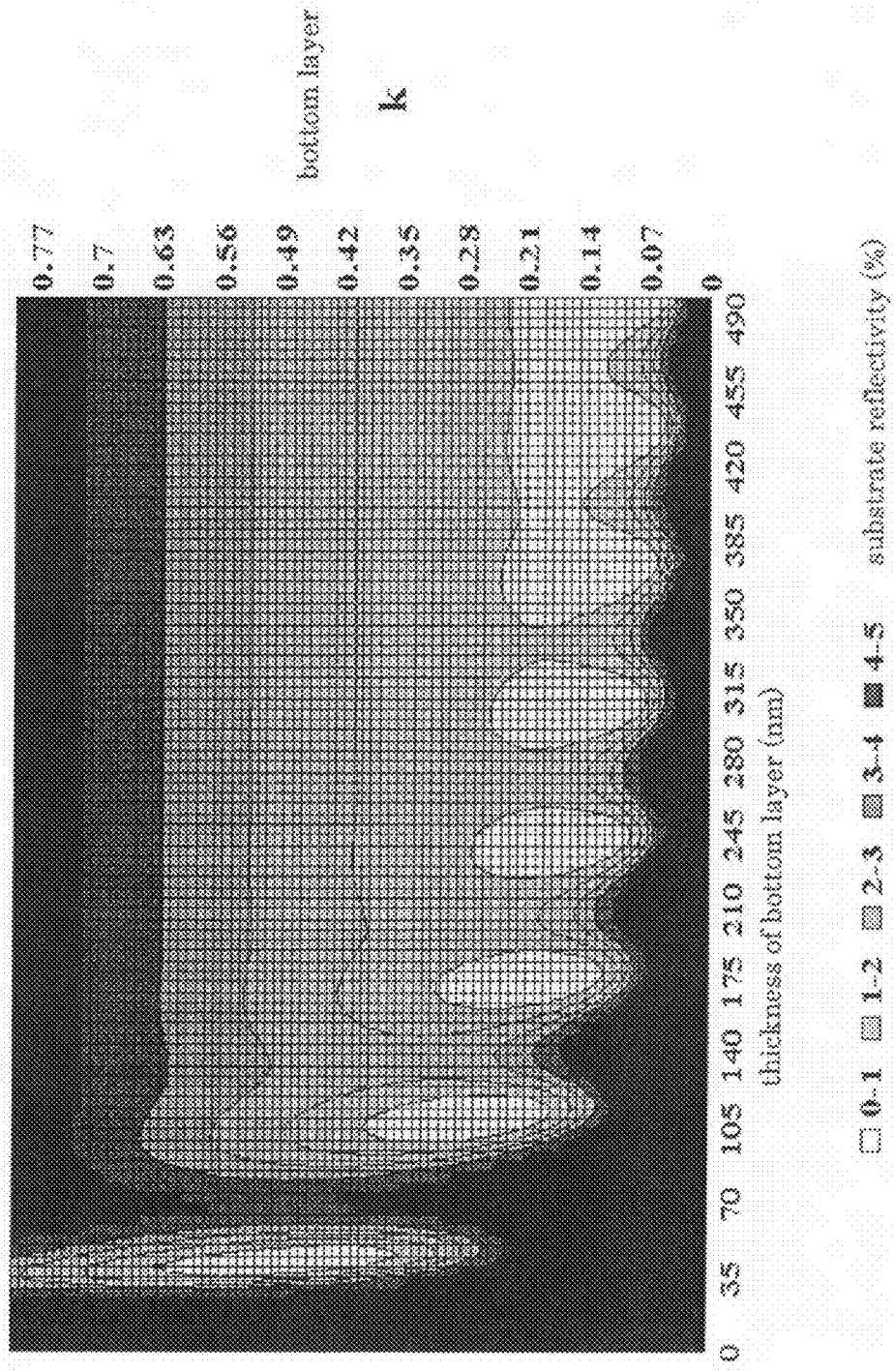
FIG. 2 is a graph showing the relation between the thickness of a bottom resist layer and reflectivity of a substrate in a bilayer-resist process where the refractive index n value of the bottom resist layer is fixed at 1.5, and the k value of the bottom resist layer is changed in the range of 0 to 0.8.
Figure 3:
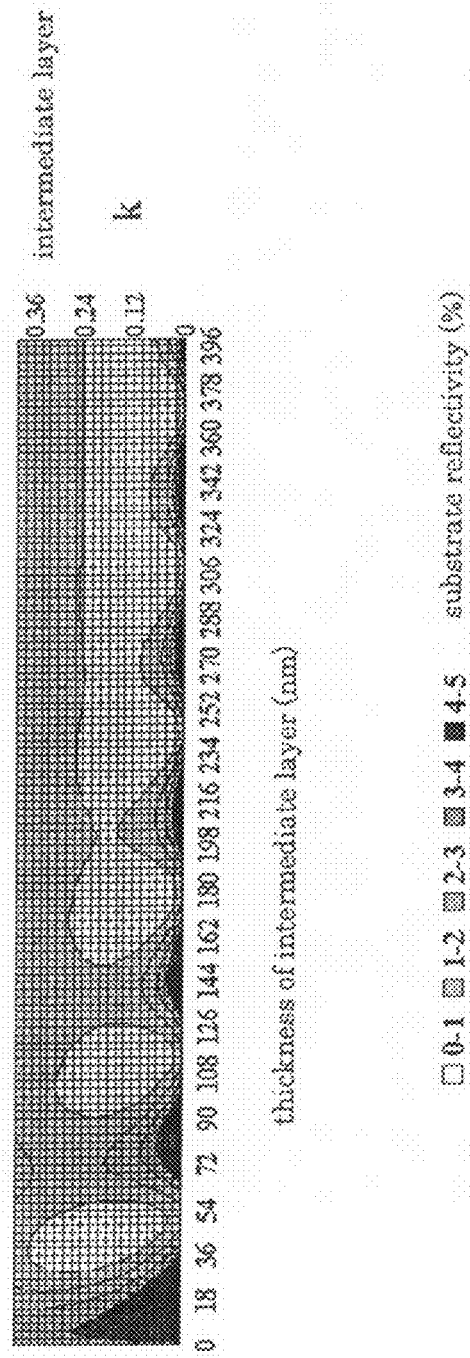
FIG. 3 is a graph showing fluctuations of reflectivity of a substrate in a trilayer-resist process where the refractive index n value of a bottom resist layer is fixed at 1.5, the k value of the bottom resist layer is fixed at 0.6, the thickness of the bottom resist layer is fixed at 500 nm, the refractive index n value of an intermediate resist layer is fixed at 1.5, the k value of the intermediate resist layer is changed in the range of 0 to 0.4, and the thickness of the intermediate resist layer is changed in the range of 0 to 400 nm.
Figure 4:
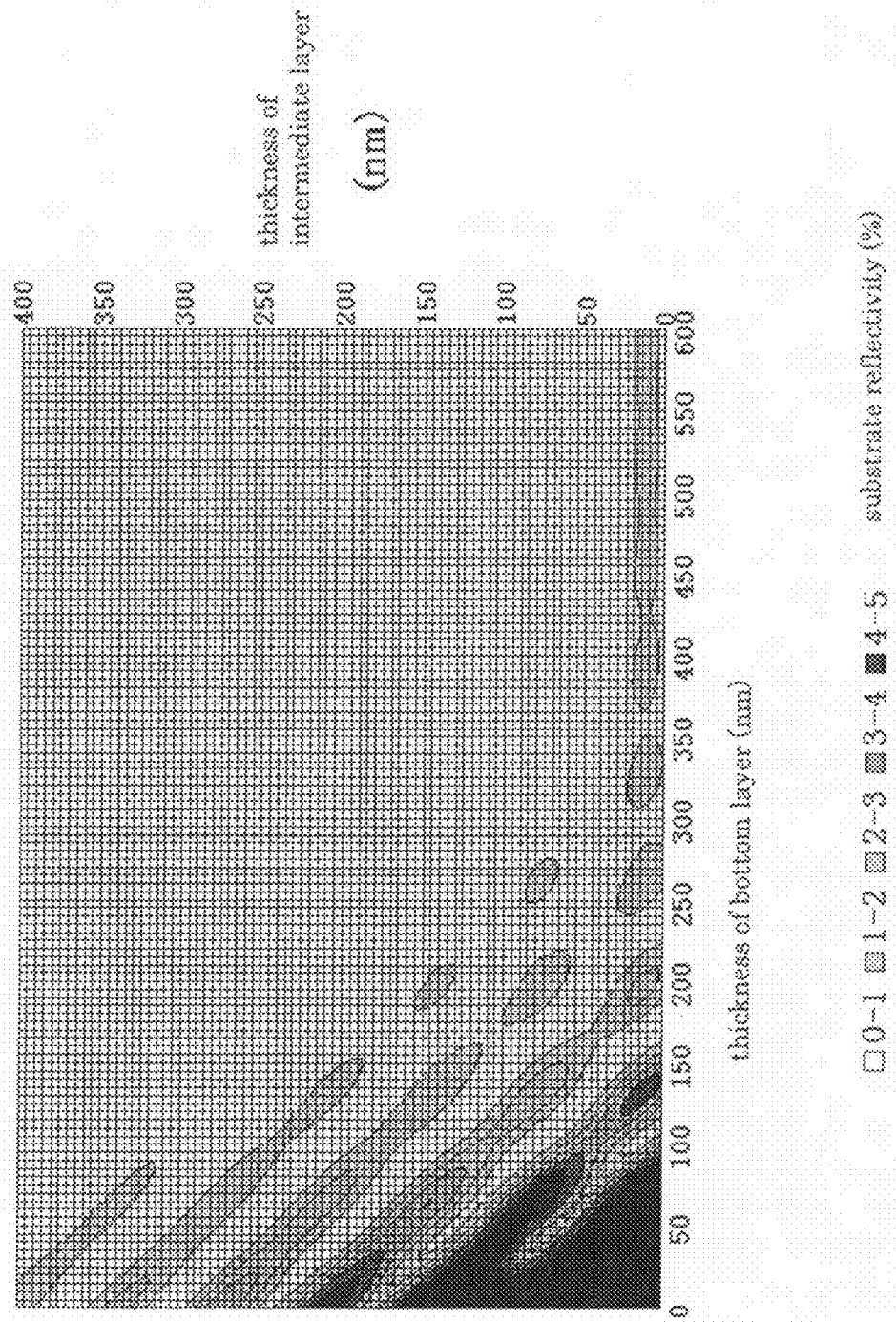
FIG. 4 is a graph showing fluctuations of reflectivity of a substrate in a trilayer-resist process where the refractive index n value of a bottom resist layer is fixed at 1.5, the k value of the bottom resist layer is fixed at 0.2, the refractive index n value of an intermediate resist layer is fixed at 1.5, the k value of the intermediate resist layer is fixed at 0.1, and the thicknesses of the bottom resist layer and the intermediate resist layer are changed respectively.
Figure 5:
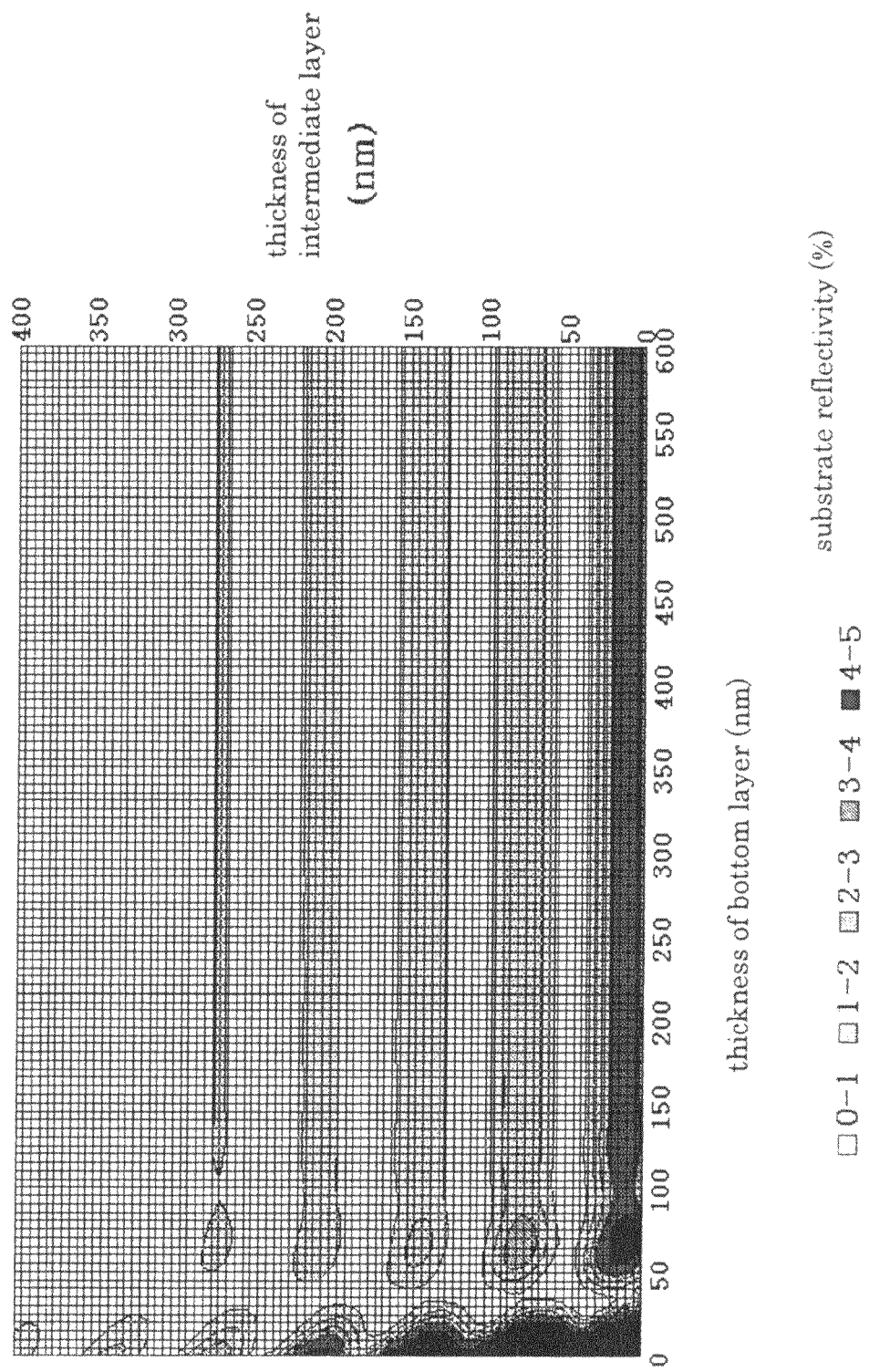
FIG. 5 is a graph showing fluctuations of reflectivity of a substrate in a trilayer-resist process where the refractive index n value of a bottom resist layer is fixed at 1.5, the k value of the bottom resist layer is fixed at 0.6, the refractive index n value of an intermediate resist layer is fixed at 1.5, the k value of the intermediate resist layer is fixed at 0.1, and the thicknesses of the bottom resist layer and the intermediate resist layer are changed respectively.

Hereafter, the present invention will be explained further in detail.

The present inventors have thoroughly investigated in order to develop a bottom resist layer composition that exhibits optimum n value and k value on exposure to shorter wavelengths, excellent etching resistance under conditions of etching a substrate, and is promising for forming a bottom resist layer used for a multilayer-resist process such as a silicon-containing bilayer resist process or a trilayer resist process using a silicon-containing intermediate layer.

As a result, the present inventors have found that a bottom resist layer composition comprising a polymer comprising a repeating unit of a nortricyclen derivative with any one of a substituted/unsubstituted carboxyl group and a substituted/unsubstituted hydroxy group and a prescribed repeating unit exhibits optimum n value and k value, excellent etching resistance under conditions of etching substrates, and is promising for forming a bottom resist layer used for a multilayer-resist process such as a silicon-containing bilayer resist process or a trilayer resist process using a silicon-containing intermediate layer. Thus the inventors have accomplished the present invention.

That is, the present invention provides a bottom resist layer composition for a multilayer-resist film used in lithography comprising, at least, a polymer comprising a repeating unit represented by the following general formula (1),

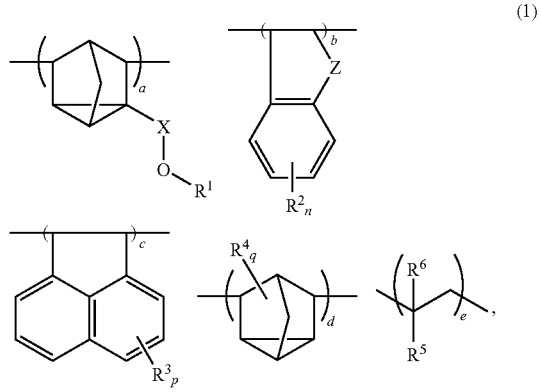

(1)

wherein $R^1$ represents a hydrogen atom or an acid labile group;

X represents any one of a single bond, —Y—C(=O)—, and a linear or branched alkylene group having 1-4 carbon atoms;

Y represents a single bond or a linear or branched alkylene group having 1-4 carbon atoms;

Z represents any one of a methylene group, an oxygen atom, and a sulfur atom;

$R^2$ and $R^3$ independently represent a $C_{1-4}$ alkyl group, a $C_{1-4}$ alkoxy group, a $C_{1-4}$ acetoxy group, a $C_{1-4}$ alkoxycarbonyl group, or a $C_{6-10}$ aryl group;

$R^4$ represents an alkyl group having 1-4 carbon atoms or an aryl group having 6-10 carbon atoms;

$R^5$ represents a phenyl group or a condensed polycyclic hydrocarbon group having 10-30 carbon atoms in which part of or all hydrogen atoms may optionally be substituted with a halogen;

n represents an integer of 0 to 4;

p and q independently represent an integer of 0 to 6;

$R^6$ represents a hydrogen atom or a methyl group; and a, b, c, d, and e satisfy $0<a<1.0, 0 \leq b \leq 0.9, 0 \leq c \leq 0.9$, then the volume of the bottom layer is increased, resulting in swelling or decrease of glass transition temperature of the bottom layer.

Meanwhile, a technique is proposed where the surface of developed resist is fluorinated with fluorine gas to decrease heat softening temperature of a resist pattern, and holes are shrank in size by heat flow (SPIE vol. 5753 (2005) p195). According to this document, cresol novolac exhibits the fastest fluorination rate, polyhydroxystyrene does the second fastest, and polymethylmethacrylate is the slowest. It is the well-known fact that electrophilic reaction by fluorine proceeds faster in aromatic groups than in alicyclic groups. It is considered that cresol novolac exhibits the fastest fluorination rate because cresol novolac has the highest ratio of aromatic groups among cresol novolac, polyhydroxystyrene and polymethylmethacrylate.

A norbornadiene, namely bicyclo[2.2.1]hepta-2,5-diene, is radical polymerizable and does not require a process of removing metallic catalyst. This process is a problem in polynorbornene obtained by polymerizing norbornenes by metathesis polymerization; and in ROMP (ring opening metathesis polymerization). Norbornadiene has a smaller ratio of hydrogen atoms than norbornenes. Therefore, it is expected that there are less amounts of hydrogen atoms substituted with fluorine atoms during etching. As a result, less amounts of pattern waviness after etching is expected.

Against this backdrop, a bottom resist layer using a copolymer of hydroxystyrene and norbornadiene is proposed (Japanese Patent Application Laid-open (KOKAI) No. 2004-205658).

However, hydroxy groups of hydroxystyrenes of the bottom resist layer has an advantage of increasing crosslink density, whereas the hydroxy groups has a problem of deteriorating etching resistance. As opposed to this, in the present invention, the repeating unit a in the general formula (1) is crosslinkable. Therefore, the repeating units b to e are not always crosslinkable, and may contribute to increase etching resistance.

In addition, in order to more certainly prevent the bottom resist layer from mixing with an overlying layer, the bottom resist layer is required to have a high crosslink density. In order to obtain a sufficiently high crosslink density, the polymer of the bottom resist layer is required to contain 30 mole % or more, preferably 50 mole % or more of a repeating unit having a hydroxy group or hydroxy groups. When hydroxystyrene is copolymerized to reach 50 mole % or more, k value becomes 0.3 or more. This can cause increase of reflection from a substrate. As opposed to this, the polymer comprising a repeating unit represented by the general formula (1) according to the present invention does not always incorporate hydroxystyrene by copolymerization. The present invention certainly prevents increase of k value by incorporating a repeating unit having crosslinkable hydroxy group or crosslinkable hydroxy groups in 30 mole % or more, preferably in 50 mole % other than hydroxystyrene.

Examples of the condensed polycyclic hydrocarbon group having 10-30 carbon atoms of $R^5$ in the general formula (1) may include: naphthalene, anthracene, pyrene, fluorene, phenanthrene, chrysene, naphthacene, pentacene, and the like.

The repeating unit a in the general formula (1) may be obtained from norbornadienes represented by the following general formula (2).

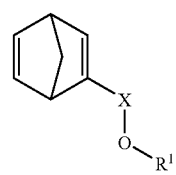

(2)

In the formula (2), $R^1$ represents a hydrogen atom or an acid labile group;

X represents any one of a single bond, —Y—C(=O)—, and a linear or branched alkylene group having 1-4 carbon atoms; and Y represents a single bond or a linear or branched alkylene group having 1-4 carbon atoms.

Various kinds of acid labile groups may be selected for the acid labile groups represented as $R^1$ in the general formulae (1) and (2). These acid labile groups may be the same or different. In —X—O—$R^1$, the hydrogen atom ($R^1$) of the hydroxyl group or the carboxyl group may be substituted with an acid labile group. Examples of such an acid labile group may include: groups represented by the following formulae (AL-10) and (AL-11), tertiary alkyl groups having 4 to 40 carbon atoms represented by the following formula (AL-12), oxoalkyl groups having 4 to 20 carbon atoms, trimethylsilyl group, and the like.

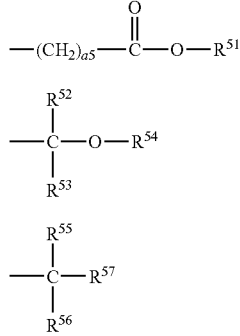

In the formulae (AL-10) and (AL-11), $R^{51}$ and $R^{54}$ represent a monovalent hydrocarbon group such as $C_{1-40}$, in particular $C_{1-20}$, linear, branched or cyclic alkyl group, which may contain hetero atom(s), such as oxygen, sulfur, nitrogen, or fluorine. $R^{52}$ and $R^{53}$ represent a hydrogen atom, or a monovalent hydrocarbon group such as $C_{1-20}$, linear, branched or cyclic alkyl group, which may contain hetero atom(s), such as oxygen, sulfur, nitrogen, or fluorine. a5 is an integer of 0 to 10. $R^{52}$ and $R^{53}$ $R^{52}$ and $R^{54}$, or $R^{53}$ and $R^{54}$ may be linked to form a $C_{3-20}$ in particular $C_{4-16}$, ring with the carbon atom to which $R^{52}$ and $R^{53}$ bond or this carbon atom and the oxygen to which $R^{54}$ bonds.

In the formula (AL-12), $R^{55}$, $R^{56}$ and $R^{57}$ independently represent a monovalent hydrocarbon group such as $C_{1-20}$, linear, branched or cyclic alkyl group, which may contain hetero atom(s), such as oxygen, sulfur, nitrogen, or fluorine. $R^{55}$ and $R^{56}$, $R^{55}$ and $R^{57}$, or $R^{56}$ and $R^{57}$ may be linked to form a $C_{3-20}$, in particular $C_{4-16}$, ring with the carbon atom to which $R^{55}$, $R^{56}$, and $R^{57}$ bond.

Illustrative examples of the compound represented by the formula (AL-10) may include: tert-butoxy carbonyl group, tert-butoxy carbonyl methyl group, tert-amyloxy carbonyl group, tert-amyloxy carbonyl methyl group, 1-ethoxy ethoxy carbonyl methyl group, 2-tetrahydropyranyl oxy-carbonyl methyl group, 2-tetrahydrofuranyl oxy-carbonyl methyl group, and the like, and further the substituents represented by the following general formulae (AL-10)-1 to (AL-10)-10.

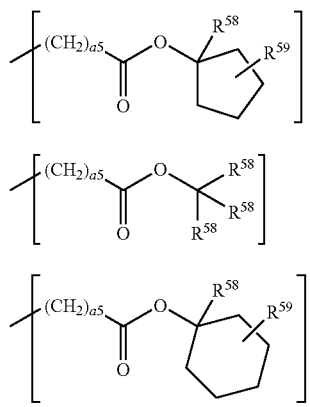

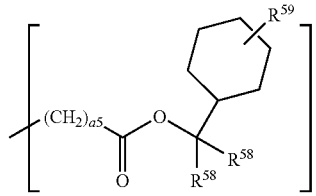

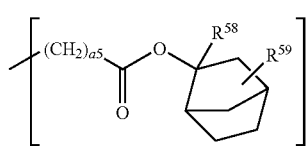

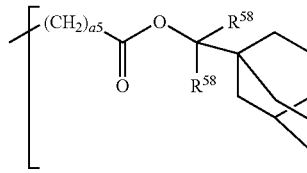

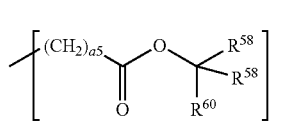

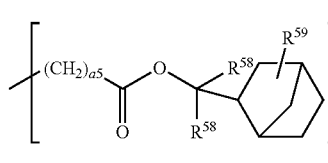

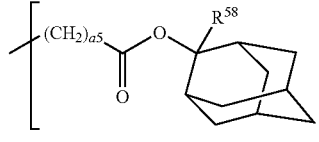

In the formulae (AL-10)-1 to (AL-10)-10, $R^{58}$ may be the same or different, and represents a linear, branched or cyclic alkyl group having 1-8 carbon atoms, an aryl group having 6-20 carbon atoms or an aralkyl group having 7-20 carbon atoms. $R^{59}$ represents a hydrogen atom, or a linear, branched or cyclic alkyl group having 1-20 carbon atoms. $R^{60}$ represents an aryl group having 6-20 carbon atoms or an aralkyl group having 7-20 carbon atoms. a5 represents the same as explained above.

Examples of an acetal compound represented by the formula (AL-11) may include those represented by the formulae (AL-11)-1 to (AL-11)-34.

—CH$_2$—O—CH$_3$ (AL-11)-1

—CH$_2$—O—CH$_2$—CH$_3$ (AL-11)-2

—CH$_2$—O—(CH$_2$)$_2$—CH$_3$ (AL-11)-3

—CH$_2$—O—(CH$_2$)$_3$—CH$_3$ (AL-11)-4

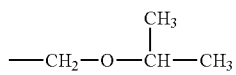 (AL-11)-5

-continued
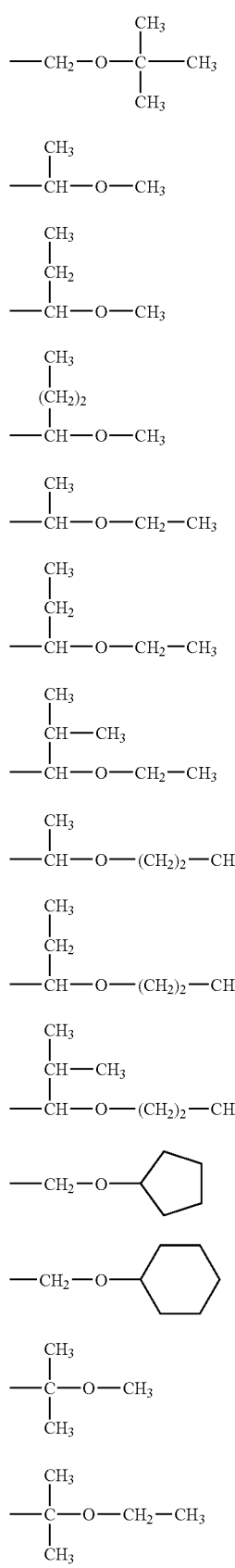
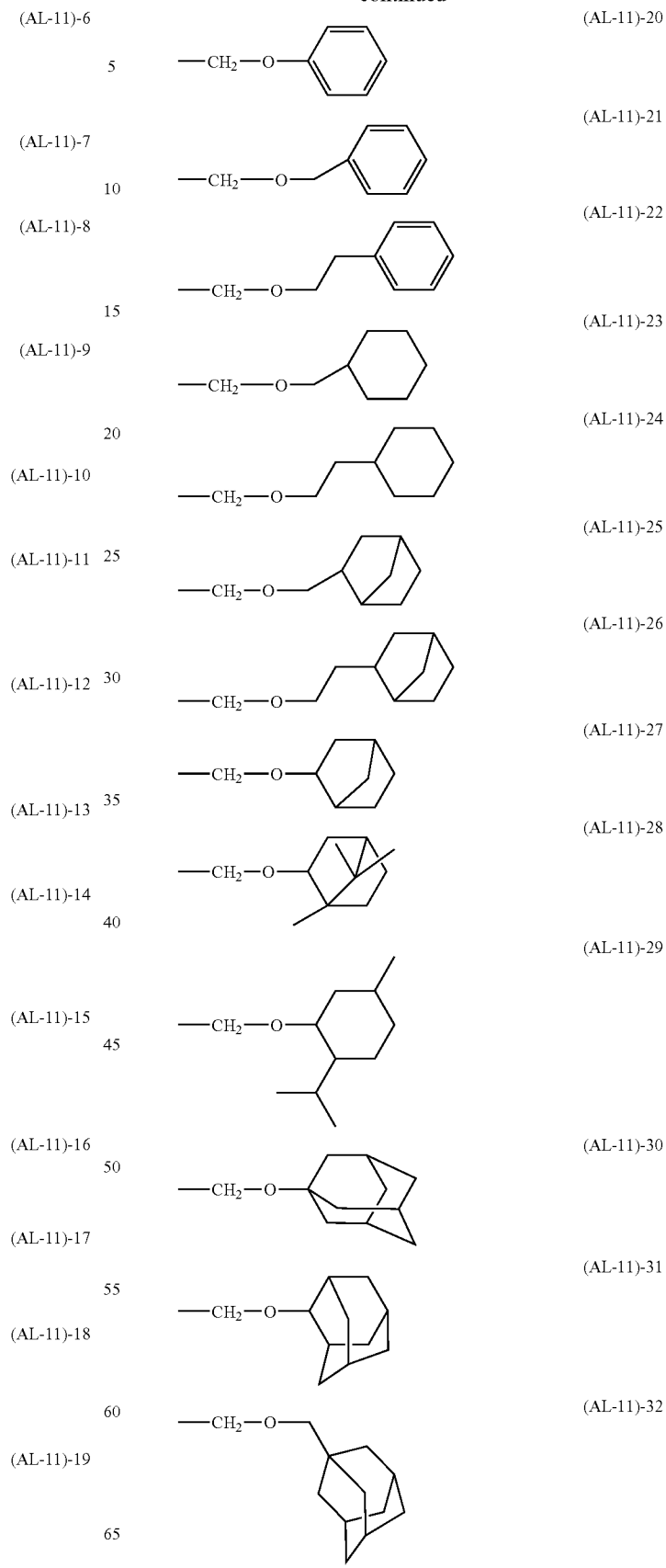

-continued
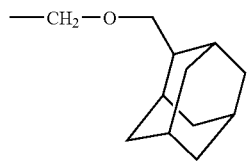
(AL-11)-33
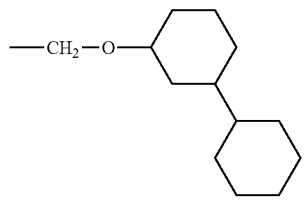
(AL-11)-34
Examples of the tertiary alkyl group shown in the formula (AL-12) may include: tert-butyl group, triethyl carbyl group, 1-ethyl norbornyl group, 1-methyl cyclohexyl group, 1-ethyl cyclopentyl group, tert-amyl group, and the like, and those represented by the following general formulae (AL-12)-1 to (AL-12)-16.
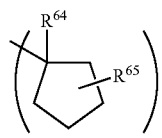
(AL-12)-1
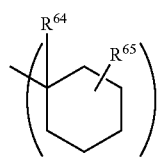
(AL-12)-2
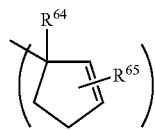
(AL-12)-3
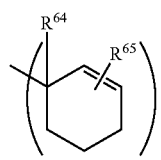
(AL-12)-4
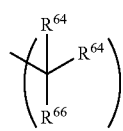
(AL-12)-5
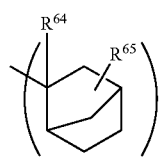
(AL-12)-6
-continued
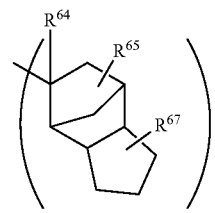
(AL-12)-7
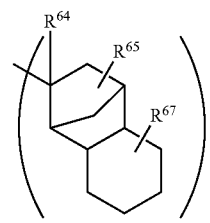
(AL-12)-8
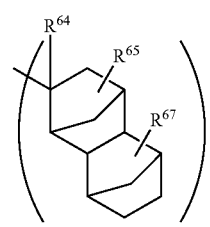
(AL-12)-9
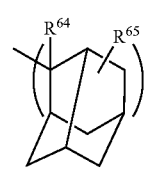
(AL-12)-10
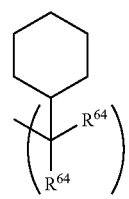
(AL-12)-11
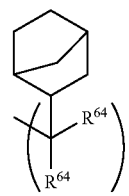
(AL-12)-12
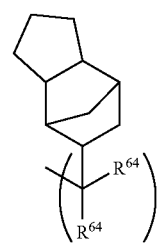
(AL-12)-13

-continued

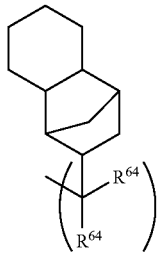
(AL-12)-14

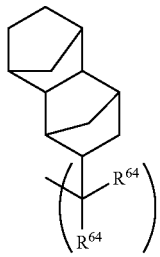
(AL-12)-15

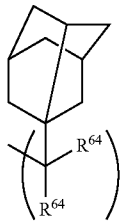
(AL-12)-16

In the formulae (AL-12)-1 to (AL-12)-16, $R^{14}$ may be the same or different, represents a linear, branched or cyclic alkyl group having 1-8 carbon atoms, an aryl group having 6-20 carbon atoms or aralkyl group having 7-20 carbon atoms. $R^{65}$ and $R^{67}$ represent a hydrogen atom, or a linear, branched or cyclic alkyl group having 1-20 carbon atoms. $R^{66}$ represents an aryl group having 6-20 carbon atoms or an aralkyl group having 7-20 carbon atoms.

The repeating unit b in the general formula (1) is derived from any one or more selected from indenes, benzofurans, and benzothiophenes. The repeating unit c in the general formula (1) is derived from any one or more selected from acenaphthylenes. The repeating unit d in the general formula (1) is derived from any one or more selected from nortricyclens. The repeating unit e in the general formula (1) is derived from any one or more selected from styrenes, $C_{10-30}$ condensed hydrocarbons having vinyl groups such as vinylnaphthalenes, vinylanthracenes, vinylfluorenes, vinylpyrenes, vinylperylenes, or vinylphenanthrenes.

Illustrative examples of the $C_{10-30}$ condensed hydrocarbons having vinyl groups for obtaining the repeating unit e may include: vinylnaphthalene, vinylanthracene, vinylpyrene, vinylfluorene, vinylphenanthrene, vinylchrysene, vinylnaphthacene, vinylpentacene, vinylacenaphthene, vinylfluorene, and the like.

The polymer that the bottom resist layer according to the present invention comprises may be a copolymer obtained by copolymerizing norbornadienes having any one of a substituted or unsubstituted carboxyl group and a substituted or unsubstituted hydroxy group represented by the general formula (2) with olefins for obtaining the repeating units b, c, d and e. Furthermore, the polymer may be a copolymer obtained by copolymerizing the norbornadienes, the olefins, and other olefins such as (meth)acrylates, vinyl ethers, maleic anhydrides, itaconic anhydrides, maleimides, vinylpyrrolidone, vinyl ethers, divinyl ethers, di(meth)acrylates, or divinyl benzenes.

In the general formula (1), a to e satisfy the range mentioned above. More preferably, a to e satisfy $0.1 \leq a < 1.0$, $0 \leq b \leq 0.9$, $\leq 0 \leq c \leq 0.9$, $0 \leq d \leq 0.9$, $0 \leq e \leq 0.9$, and $00.1 < a+b+c+d+e \leq 1.0$. Still more preferably, a to e satisfy $0.15 \leq a < 1.0$, $0 \leq b \leq 0.8$, $0 \leq c \leq 0.8$, $0 \leq d \leq 0.8$, $0 \leq e \leq 0.8$, and $0.3 \leq a+b+c+d+e \leq 1.0$.

When the repeating unit derived from olefins other than the repeating units a to e are referred to as "repeating unit f", f preferably satisfies $0 \leq f \leq 0.8$, and more preferably $0 \leq f \leq 0.7$. Then a to f preferably satisfy $a+b+c+d+e+f=1$. "$a+b+c+d+e+f=1$" means that the total amounts of the repeating units a, b, c, d, e, and f is 100 mole % relative to the total amounts of all the repeating units in a polymer (copolymer) comprising the repeating units a, b, c, d, e, and f.

Examples of a monomer for obtaining the repeating unit a represented by the general formula (1) may be norbornadienes having any one of a substituted or unsubstituted carboxyl group and a substituted or unsubstituted hydroxy group represented by the general formula (2). The hydrogen atom of the carboxyl group or the hydroxy group upon polymerization may be substituted with an acetyl group, a formyl group, a pivaloyl group, an acetal group, a tertiary alkyl group having 4 to 16 carbons, trimethylsilyl group, or the like.

In order to synthesize the copolymer included in the bottom resist layer composition according to the present invention, as an example, the following method may be used: placing in an organic solvent at least one of norbornadienes having any one of a carboxyl group and a hydroxy group that are substituted or unsubstituted, and one or more types of olefin monomers for obtaining the repeating units b, c, d and e; adding a radical polymerization initiator or a cationic polymerization initiator to the solvent, and conducting thermal polymerization. It is also possible to substitute a hydroxy group or hydroxy groups of a monomer having a hydroxy group or hydroxy groups with an acetyl group or acetyl groups; and to subject thus-obtained polymer to base hydrolysis in an organic solvent, thereby deprotecting the acetyl groups.

Examples of the organic solvent used at the time of polymerization may include: toluene, benzene, tetrahydrofuran, diethyl ether, dioxane, and the like. Examples of the polymerization initiator may include: 2,2'-azobisisobutyronitrile (AIBN), 2,2'-azobis(2,4-dimethyl valeronitrile), dimethyl-2,2-azobis(2-methyl propionate), benzoyl peroxide, lauroyl peroxide, and the like. Polymerization is preferably conducted by heating to 50° C. to 80° C. Examples of the cationic polymerization initiator may include: acids such as sulfuric acid, phosphoric acid, hydrochloric acid, nitric acid, hypochlorous acid, trichloroacetic acid, trifluoroacetic acid, methansulfonic acid, trifluoromethanesulfonic acid, or tosic acid; Friedel-Crafts catalysts such as $BF_3$, $AlCl_3$, $TiCl_4$, or $SnCl_4$; and substances that tend to produce cations such as $I_2$ or $(C_6H_5)_3CCl$.

The reaction time may be 2 to 100 hours, preferably 5 to 20 hours. Examples of a base used for the base hydrolysis may include aqueous ammonia, triethylamine, or the like. The reaction temperature of the base hydrolysis is preferably −20 to 100° C., more preferably 0 to 60° C. The reaction time of the base hydrolysis is preferably 0.2 to 100 hours, more preferably 0.5 to 20 hours.

The copolymer according to the present invention preferably has a weight-average molecular weight relative to polystyrene measured by gel permeation chromatography (GPC)

in the range of 1,500 to 200,000, more preferably 2,000 to 100,000. The molecular weight distribution of the copolymer is not particularly restricted. Low molecular components and high molecular components may be removed by fractionation, thereby decreasing molecular weight distribution. It is also possible to mix two or more polymers represented by the general formula (1) which have different molecular weights or molecular weight distributions; or two or more polymers represented by the general formula (1) which have different composition ratios.

In order to increase transparency at a wavelength of 193 nm of the copolymer included in the bottom resist layer composition according to the present invention, in particular, the copolymer comprising a repeating unit represented by the general formula (1), the copolymers may be hydrogenated. A preferred ratio of hydrogenation is 80 mole % or less of aromatic groups, more preferably 60 mole % or less.

A base resin for the bottom resist layer composition according to the present invention has a feature of comprising a polymer comprising the repeating unit a derived from a norbornadiene having any one of a substituted or unsubstituted carboxyl group and a substituted or unsubstituted hydroxy group; and at least any one of the prescribed repeating units b to e. Furthermore, this polymer may be blended with conventional polymers known as antireflective coating compositions.

Nortricyclen has a glass transition temperature equal to or more than 150° C. A polymer made of nortricyclen alone can exhibit poor filling property in filling deep holes such as via holes. In order to fill holes without generating voids, a technique to be used is to fill a hole to its bottom by using a resin with low glass transition temperature while the resin is subjected to thermal flow at temperatures less than the temperature of crosslinking (for example, see Japanese Patent Application Laid-open (KOKAI) No. 2000-294504). Blending the nortricyclen polymer with polymers having low glass transition temperatures, particularly 180° C. or less, especially in the range of from 100 to 170° C., improves filling properties of the polymer. Examples of the polymers having low glass transition temperatures may include: one or more copolymers selected from acrylates, vinyl alcohols, vinyl ethers, allyl ethers, styrene derivatives, allyl benzene derivatives, and olefins such as ethylene, propylene, or butadiene; polymers obtained by ring opening metathesis polymerization, novolac resins, dicyclopentadiene resins, phenolic ballast compounds, calixarenes and fullerenes.

Nortricyclen of the repeating unit a hardly absorbs light at the wavelength of 193 nm. For the purpose of controlling k value of the composition, it is desirable to blend a composition having an aromatic group. This also improves filling property and crosslinking efficiency.

As mentioned below, the bottom resist layer composition according to the present invention preferably further comprises any one or more of an organic solvent, an acid generator, and a crosslinker.

One of the properties required for bottom resist layers is that the layers do not intermix with a top resist layer, and low molecular components hardly diffuse to the top resist layer from the bottom layer (For example, see Proc. SPIE Vol. 2195, p225-229 (1994)). In order to prevent the intermixing and diffusion, there is generally used a method of forming a bottom resist layer on a substrate by spin-coating method or the like and then baking the bottom resist layer to carry out thermal crosslinking. In order to carry out this method, there are a method of adding a crosslinker as a component of a bottom resist layer composition, and a method of incorporating a crosslinkable substituent into a polymer. An example of the method of incorporating a crosslinkable substituent into a polymer is to turn hydroxy groups of the nortricyclen resin represented by the general formula (1) into glycidyl ethers.

Examples of the crosslinker which can be used in the present invention may include: a melamine compound, a guanamine compound, a glycol uryl compound or an urea compound each substituted with at least one group selected from a methylol group, an alkoxy methyl group and an acyloxy methyl group; an epoxy compound, an isocyanate compound, an azide compound, a compound including a double bond such as an alkenyl ether group, and the like. These compounds may be used as an additive, or may be introduced into a polymer side chain as a pendant group. Moreover, a compound containing a hydroxy group may also be used as a crosslinker.

Examples of the epoxy compound among the above-mentioned specific examples of the crosslinker may include: tris (2,3-epoxypropyl)isocyanurate, trimethylol methanetriglycidyl ether, trimethylol propane triglycidyl ether, triethylol ethanetriglycidyl ether, and the like. Examples of the melamine compound may include: hexamethylol melamine, hexamethoxy methyl melamine, a compound in which 1 to 6 methylol groups of hexamethylol melamine are methoxy methylated or a mixture thereof, hexamethoxy ethyl melamine, hexaacyloxy methyl melamine, a compound in which 1 to 6 methylol groups of hexamethylol melamine are acyloxy methylated or a mixture thereof, and the like. Examples of a guanamine compound may include: tetramethylol guanamine, tetra methoxy methyl guanamine, a compound in which 1 to 4 methylol groups of tetramethylol guanamine are methoxy-methylated and a mixture thereof, tetramethoxy ethyl guanamine, tetraacyloxy guanamine, a compound in which 1 to 4 methylol groups of tetramethylol guanamine are acyloxy-methylated and a mixture thereof, and the like. Examples of a glycol uryl compound may include: tetramethylol glycol uryl, tetramethoxy glycol uryl, tetramethoxy methyl-glycol uryl, a compound in which 1-4 methylol groups of tetramethylol glycol uryl are methoxy methylated or a mixture thereof, and a compound in which 1 to 4 methylol group of tetramethylol glycol uryl are acyloxy methylated or a mixture thereof, and the like. Examples of a urea compound may include: tetra methylol urea, tetra methoxy methyl urea, a compound in which 1 to 4 methylol groups of tetra methylol urea are methoxy-methylated or a mixture thereof, and tetra methoxy ethyl urea, and the like.

Examples of the isocyanate compound may include: tolylene diisocyanate, diphenyl methane diisocyanate, hexamethylene diisocyanate, cyclohexane diisocyanate, and the like. Examples of the azide compound may include: 1,1'-biphenyl-4,4'-bisazide, 4,4'-methylidene bisazide, and 4,4'-oxy-bisazide, and the like.

Examples of the compound containing an alkenyl ether group may include: ethylene glycol divinyl ether, triethyleneglycol divinyl ether, 1, 2-propanediol divinyl ether, 1,4-butanediol divinyl ether, tetramethylene-glycol divinyl ether, neo pentyl glycol divinyl ether, trimethylol-propane trivinyl ether, hexane diol divinyl ether, 1,4-cyclohexane diol divinyl ether, pentaerythritol trivinyl ether, pentaerythritol tetra vinyl ether, sorbitol tetra vinyl ether, sorbitol penta vinyl ether, and trimethylol-propane trivinyl ether, and the like.

In order to increase crosslinking efficiency of a polymer included in the bottom resist layer composition according to the present invention, namely the polymer comprising the repeating unit represented by the general formula (1), it is effective to add a compound comprising a hydroxy group or hydroxy groups. In particular, compounds which contains two or more hydroxy groups in a molecule is desirable.

Examples of the compound containing a hydroxy group or hydroxy groups may include: a compound containing an alcohol group such as naphthol novolak, m- and p-cresol novolak, a naphthol dicyclopentadiene novolak, m- and p-cresol dicyclopentadiene novolak, 4,8-bis(hydroxymethyl) tricyclo[5.2.1.0$^{2,6}$]-decane, pentaerythritol, 1,2,6-hexanetriol, 4,4',4"-methylidene tris cyclohexanol, 4,4'-[1-[4-[1-(4-hydroxy cyclohexyl)-1-methylethyl]phenyl]ethylidene] biscyclohexanol, [1,1'-bicyclohexyl]-4,4'-diol, methylene biscyclohexanol, decahydro naphthalene-2,6-diol, and [1,1'-bicyclohexyl]-3,3',4,4'-tetrahydroxy or the like; and phenolic ballast compounds, such as bisphenol, methylene bisphenol, 2,2'-methylene bis[4-methyl phenol], 4,4'-methylidene-bis [2,6-dimethylphenol], 4,4'-(1-methyl-ethylidene) bis[2-methyl phenol], 4,4'-cyclohexylidene bisphenol, 4,4'-(1,3-dimethyl butylidene)bisphenol, 4,4'-(1-methyl-ethylidene) bis[2,6-dimethyl phenol], 4,4'-oxybisphenol, 4,4'-methylene bisphenol, bis(4-hydroxyphenyl)methanone, 4,4'-methylene bis[2-methylphenol], 4,4'-[1,4-phenylene bis(1-methyl ethylidene)]bisphenol, 4,4'-(1,2-ethane-di-yl)bisphenol, 4,4'-(diethyl silylene)bisphenol, 4,4'-[2,2,2-trifluoro-1-(trifluoromethyl)ethylidene]bisphenol, 4,4',41"-methylidene trisphenol, 4,4'-[1-(4-hydroxyphenyl)-1-methylethyl]phenyl]ethylidene]bisphenol, 2,6-bis[(2-hydroxy-5-methylphenyl)methyl]-4-methyl phenol, 4,4',4"-ethylidyne tris[2-methyl phenol], 4,4',4"-ethylidyne trisphenol, 4,6-bis[(4-hydroxy phenyl)methyl]1,3-benzene diol, 4,4'-[(3,4-dihydroxy phenyl)methylene]bis[2-methylphenol], 4,4',4", 4'"-(1,2-ethanediylidene)tetrakisphenol, 2,2'-methylene bis [6-[(2-hydroxy-5-methylphenyl)methyl]-4-methylphenol], 4,4',4",4'"-(1,4-phenylene dimethylidyne)tetrakisphenol, 2,4,6-tris(4-hydroxy phenylmethyl)-1,3-benzenediol, 2,4', 4"-methylidene trisphenol, 4,4',4'"-(3-methyl-1-propanyl-3-ylidene)trisphenol, 2,6-bis[(4-hydroxy-3-phlorophenyl)methyl]-4-fluorophenol, 2,6-bis[4-hydroxy-3-fluorophenyl] methyl]-4-fluorophenol, 3,6-bis[(3,5-dimethyl-4-hydroxyphenyl)methyl]1,2-benzenediol, 4,6-bis[(3,5-dimethyl-4-hydroxy phenyl)methyl]1,3-benzenediol, p-methylcalics[4]allene, 2,2'-methylene bis[6-[(2,5/3,6-dimethyl-4/2-hydroxyphenyl)methyl]-4-methylphenol, 2,2'-methylene bis[6-[(3,5-dimethyl-4-hydroxyphenyl)methyl]-4-methyl phenol, 4,4',4"1,4'"-tetrakis[(1-methyl ethylidene)bis (1,4-cyclohexylidene)]-phenol, 6,6'-methylene bis[4-(4-hydroxy phenyl methyl)-1,2,3-benzentriol, 3,3',5,5'-tetrakis [(5-methyl-2-hydroxyphenyl)methyl]-[(1,1'-biphenyl)-4,4'-diol], and the like.

The amount of the crosslinker to be added to the bottom resist layer composition according to the present invention is preferably 5 to 50 parts (parts by mass; hereinafter, parts denote "parts by mass"), more preferably 10 to 40 parts per 100 parts of the base resin (all the resins). When the amount is 5 parts or more, a bottom resist layer is less prone to mix with a resist layer. When the amount is 50 parts or less, there is less possibility that antireflection effect of the bottom resist layer is deteriorated or cracks are generated in the formed bottom resist layer.

In order to promote crosslinking reactions by heat in the bottom resist layer composition according to the present invention, an acid generator may be further added. As for acid generators, there are acid generators that generate acids upon thermal decomposition and acid generators that generates acids upon photoirradiation. Such a photoacid generator and/or a thermalacid generator may be added.

Examples of an acid generator that may be added to the bottom resist layer composition according to the present invention are as follows:

(i) an onium salt represented by the following general formulae (P1a-1), (P1a-2), (P1a-3) or (P1b),
(ii) a diazomethane derivative represented by the following general formula (P2),
(iii) a glyoxime derivative represented by the following general formula (P3),
(iv) a bis sulfone derivative represented by the following general formula (P4),
(v) a sulfonate of an N-hydroxy imide compound represented by the following general formula (P5),
(vi) a β-keto sulfonic-acid derivative,
(vii) a disulfone derivative,
(viii) a nitro benzyl sulfonate derivative, and
(ix) a sulfonate derivative, and the like.

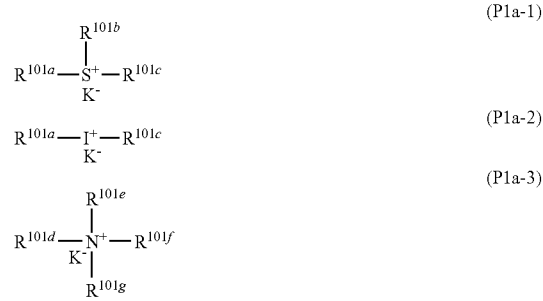

(In the formulae, $R^{101a}$, $R^{101b}$, and $R^{101c}$ independently represent a linear, branched or cyclic alkyl group, alkenyl group, oxoalkyl group or oxoalkenyl group each having 1-12 carbon atoms, an aryl group having 6-20 carbon atoms, or an aralkyl group or an aryl oxoalkyl group having 7-12 carbon atoms. Hydrogen atoms in part or in entirety of these groups may be substituted with an alkoxy group or the like. $R^{101b}$ and $R^{101c}$ may form a ring. In the case that they form a ring, $R^{101b}$ and $R^{101c}$ represent an alkylene group having 1-6 carbon atoms respectively. $K^-$ represents a non-nucleophilic counter ion. $R^{101d}$, $R^{101e}$, $R^{101f}$ and $R^{101g}$ are represented by adding a hydrogen atom to $R^{101a}$, $R^{101b}$, and $R^{101c}$. $R^{101d}$ and $R^{101e}$, and $R^{101d}$, $R^{101e}$ and $R^{101f}$ can form a ring respectively. When they form a ring, $R^{101d}$ and $R^{101e}$, and $R^{101d}$, $R^{101e}$, and $R^{101f}$, represent an alkylene group having 3-10 carbon atoms or a heteroaromatic ring having the nitrogen atom in the formula in the ring.)

The $R^{101a}$, $R^{101b}$, $R^{101c}$, $R^{101d}$, $R^{101e}$, $R^{101f}$ and $R^{101g}$ may be the same or different mutually. Examples thereof as an alkyl group may include: a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropyl methyl group, a 4-methyl cyclohexyl group, a cyclohexyl methyl group, a norbornyl group, an adamantyl group, and the like. Examples of an alkenyl group may include: a vinyl group, an allyl group, a propenyl group, a butenyl group, a hexenyl group, a cyclohexenyl group, and the like. Examples of an oxo alkyl group may include: 2-oxocyclopentyl group, 2-oxocyclohexyl group, 2-oxopropyl group, 2-cyclopentyl-2-oxoethyl group, 2-cyclohexyl-2-oxoethyl group, 2-(4-methylcyclohexyl)-2-oxoethyl group, and the like. Examples of an aryl group may include: a phenyl group, a naphthyl group, and the like; an alkoxy phenyl group such as p-methoxyphenyl group, m-methoxyphenyl group, o-methoxyphenyl group, an ethoxyphenyl group, p-tert-butoxyphenyl group or m-tert-butoxy phenyl group; an alkyl phenyl group such as 2-methylphenyl group, 3-methylphenyl group, 4-methylphenyl group, an ethylphenyl group, 4-tert-butylphenyl group, 4-butylphenyl group, or a dimethyl phenyl group; an alkyl naphthyl group such as a methylnaphthyl group or an ethyl naphthyl group; an alkoxy naphthyl group such as a methoxy naphthyl group or an ethoxy naphthyl group; a dialkyl naphthyl group such as a dimethyl naphthyl group or a diethyl naphthyl group; a dialkoxy naphthyl group such as a dimethoxy naphthyl group or a diethoxy naphthyl group. Examples of an aralkyl group may include a benzyl group, a phenylethyl group, a phenethyl group, and the like. Examples of an aryl oxoalkyl group may include: 2-aryl-2-oxoethyl group such as 2-phenyl-2-oxoethyl group, 2-(1-naphthyl)-2-oxoethyl group, 2-(2-naphthyl)-2-oxoethyl group, and the like.

Examples of a non-nucleophilic counter ion as K⁻ may include: a halide ion such as a chloride ion or a bromide ion; a fluoro alkyl sulfonate such as triflate, 1,1,1-trifluoro ethanesulfonate, or nonafluoro butane sulfonate; an aryl sulfonate such as tosylate, benzene sulfonate, 4-fluorobenzene sulfonate, or 1,2,3,4,5-pentafluoro benzene sulfonate; and an alkyl sulfonate such as mesylate or butane sulfonate; imidic acid such as bis(trifluoromethyl sulfonyl)imide, bis(perfluoroethyl sulfonyl)imide, or bis(perfluorobutyl sulfonyl)imide; methide acid such as tris(trifluoromethyl sulfonyl)methide, or tris(perfluoroethyl sulfonyl)methide; sulfonates represented by the following general formula (K-1) which are substituted with fluorine atoms at a position; and sulfonates represented by the following general formula (K-2) which are substituted with fluorine atoms at α and β positions.

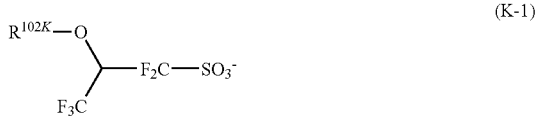

(K-1)

(K-2)

In the general formula (K-1), $R^{102K}$ represents a hydrogen atom, a linear, branched or cyclic alkyl group, acyl group each having 1-20 carbon atoms, an alkenyl group having 2-20 carbon atoms, an aryl group having 6-20 carbon atoms, or an aryloxy group.

In the general formula (K-2), $R^{103K}$ represents a hydrogen atom, a linear, branched or cyclic alkyl group having 1-20 carbon atoms, an alkenyl group having 2-20 carbon atoms, or an aryl group having 6-20 carbon atoms.

In addition, examples of a heteroaromatic ring in which $R^{101d}$, $R^{101e}$, $R^{101f}$ and $R^{101g}$ have the nitrogen atom in the formula in the ring may include: an imidazole derivative (for example, imidazole, 4-methyl imidazole, 4-methyl-2-phenyl imidazole, or the like), a pyrazole derivative, a furazan derivative, a pyrroline derivative (for example, pyrroline, 2-methyl-1-pyrroline, or the like), a pyrrolidine derivative (for example, pyrrolidine, N-methyl pyrrolidine, pyrrolidinone, N-methylpyrolidone, or the like), an imidazoline derivative, an imidazolidine derivative, a pyridine derivative (for example, pyridine, methylpyridine, ethyl pyridine, propyl pyridine, butyl pyridine, 4-(1-butyl pentyl)pyridine, dimethylpyridine, trimethyl pyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridone, 4-pyrrolidino pyridine, 1-methyl-4-phenyl pyridine, 2-(1-ethylpropyl)pyridine, amino pyridine, dimethyl amino pyridine, or the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, or the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, 1,10-phenanthroline derivative, an adenine derivative, an adenosine derivative, a guanine derivative, a guanosine derivative, an uracil derivative, an uridine derivative, and the like.

Although (P1a-1) and (P1a-2) have both effects of a photo acid generator and a thermal acid generator, (P1a-3) acts as a thermal acid generator.

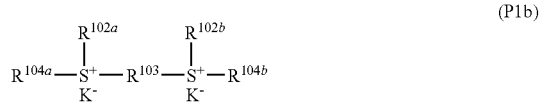

(P1b)

(In the formula, $R^{102a}$ and $R^{102b}$ each represents a linear, branched or cyclic alkyl group having 1-8 carbon atoms. $R^{103}$ represents a linear, branched or cyclic alkylene group having 1-10 carbon atoms. $R^{104a}$ and $R^{104b}$ each represents a 2-oxoalkyl group having 3-7 carbon atoms. K⁻ represents a non-nucleophilic counter ion.)

Examples of the alkyl group of $R^{102a}$ and $R^{102b}$ may include: a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cyclopropylmethyl group, 4-methylcyclohexyl group, a cyclohexyl methyl group, and the like.

Examples of the alkylene group of $R^{103}$ may include: a methylene group, an ethylene group, a propylene group, a butylene group, a pentylene group, a hexylene group, a heptylene group, an octylene group, a nonylene group, 1,4-cyclohexylene group, 1,2-cyclohexylene group, 1,3-cyclopentylene group, 1,4-cyclooctylene group, 1,4-cyclohexane dimethylene group, and the like.

Examples of the 2-oxoalkyl group of $R^{104a}$ and $R^{104b}$ may include: 2-oxopropyl group, 2-oxocyclopentyl group, 2-oxocyclohexyl group, 2-oxocycloheptyl group, and the like.

Examples of K⁻ may include the same as mentioned in the formulae (P1a-1), (P1a-2) and (P1a-3).

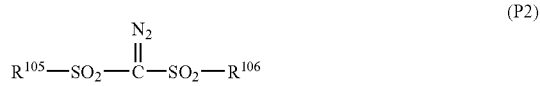

(P2)

(In the formula, $R^{105}$ and $R^{106}$ independently represent a linear, branched or cyclic alkyl group or an alkyl halide group each having 1-12 carbon atoms, an aryl group or an aryl halide group each having 6-20 carbon atoms, or an aralkyl group having 7-12 carbon atoms.)

Examples of an alkyl group as $R^{105}$ and $R^{106}$ may include: a methyl group, an ethyl group, a propyl group, an isopropyl group, a n-butyl group, a sec-butyl group, a tert-butyl group, a pentyl group, a hexyl group, a heptyl group, an octyl group, an amyl group, a cyclopentyl group, a cyclohexyl group, a cycloheptyl group, a norbornyl group, an adamantyl group, and the like.

Examples of an alkyl halide group as $R^{105}$ and $R^{106}$ may include: trifluoromethyl group, 1,1,1-trifluoroethyl group, 1,1,1-trichloroethyl group, nonafluoro butyl group, and the like. Examples of an aryl group may include: a phenyl group, an alkoxyphenyl group such as p-methoxyphenyl group, m-methoxyphenyl group, o-methoxyphenyl group, an ethoxyphenyl group, p-tert-butoxyphenyl group, or m-tert-butoxyphenyl group; and an alkylphenyl group such as 2-methylphenyl group, 3-methylphenyl group, 4-methylphenyl group, an ethylphenyl group, 4-tert-butylphenyl group, 4-butylphenyl group, or a dimethylphenyl group.

Examples of an aryl halide group as $R^{105}$ and $R^{106}$ may include: a fluorophenyl group, a chlorophenyl group, 1,2,3,4,5-pentafluoro phenyl group, and the like.

Examples of an aralkyl group as $R^{105}$ and $R^{106}$ may include: a benzyl group, a phenethyl group, and the like.

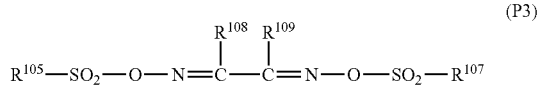

(P3)

(In the formula, $R^{107}$, $R^{108}$ and $R^{109}$ independently represent a linear, branched, cyclic alkyl group or an alkyl halide group each having 1-12 carbon atoms, an aryl group or an aryl halide group each having 6-20 carbon atoms, or an aralkyl group having 7-12 carbon atoms. $R^{108}$ and $R^{109}$ may be bonded to each other and form a cyclic structure. When they form a cyclic structure, $R^{108}$ and $R^{109}$ each independently represents a linear or branched alkylene group having 1-6 carbon atoms.)

Examples of the alkyl group, the alkyl halide group, the aryl group, the aryl halide group, and the aralkyl group as $R^{107}$, $R^{108}$ and $R^{109}$ may be the same as those explained for $R^{105}$ and $R^{106}$. Examples of an alkylene group for $R^{108}$ and $R^{109}$ may include: a methylene group, an ethylene group, a propylene group, a butylene group, a hexylene group, and the like.

(P4)

(In the formula, $R^{101a}$ and $R^{101b}$ are the same as explained above.)

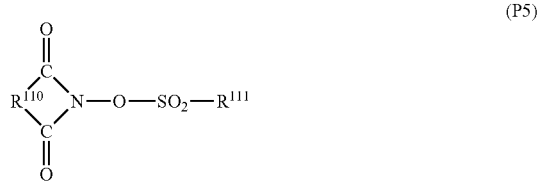

(P5)

(In the formula, $R^{110}$ represents an arylene group having 6-10 carbon atoms, an alkylene group having 1-6 carbon atoms or an alkenylene group having 2-6 carbon atoms. Hydrogen atoms in part or in entirety of these groups may be further substituted with a linear or branched alkyl group or an alkoxy group each having 1-4 carbon atoms, a nitro group, an acetyl group, or a phenyl group. $R^{111}$ represents a linear, branched or substituted alkyl group, alkenyl group or alkoxy alkyl group each having 1-8 carbon atoms, a phenyl group or a naphthyl group. Hydrogen atoms in part or in entirety of these groups may be substituted with an alkyl group or an alkoxy group each having 1-4 carbon atoms; a phenyl group which may be substituted with an alkyl group or an alkoxy group each having 1-4 carbon atoms, a nitro group or an acetyl group; a hetero aromatic group having 3-5 carbon atoms; or a chlorine atom or a fluorine atom.)

Examples of the arylene group as $R^{110}$ may include: 1,2-phenylene group, 1,8-naphtylene group, and the like. Examples of the alkylene group may include: a methylene group, an ethylene group, a trimethylene group, a tetramethylene group, a phenylethylene group, a norbornane-2,3-di-yl group, and the like. Examples of the alkenylene group may include: 1,2-vinylene group, 1-phenyl-1,2-vinylene group, 5-norbornene-2,3-di-yl group, and the like.

Examples of the alkyl group as $R^{111}$ may be the same as those for $R^{101a}$-$R^{101c}$. Examples of the alkenyl group as $R^{111}$ may include: a vinyl group, a 1-propenyl group, an allyl group, a 1-butenyl group, a 3-butenyl group, an isoprenyl group, a 1-pentenyl group, a 3-pentenyl group, a 4-pentenyl group, a dimethyl allyl group, a 1-hexenyl group, a 3-hexenyl group, a 5-hexenyl group, a 1-heptenyl group, a 3-heptenyl group, a 6-heptenyl group, a 7-octenyl group, and the like. Examples of the alkoxy alkyl group may include: a methoxy methyl group, an ethoxy methyl group, a propoxy methyl group, a butoxy methyl group, a pentyloxy methyl group, a hexyloxy methyl group, a heptyloxy methyl group, a methoxy ethyl group, an ethoxy ethyl group, a propoxy ethyl group, a butoxy ethyl group, a pentyloxy ethyl group, a hexyloxy ethyl group, a methoxy propyl group, an ethoxy propyl group, a propoxy propyl group, a butoxy propyl group, a methoxy butyl group, an ethoxy butyl group, a propoxy butyl group, a methoxy pentyl group, an ethoxy pentyl group, a methoxy hexyl group, a methoxy heptyl group, and the like.

Examples of the alkyl group having 1-4 carbon atoms which may be further substituted may include: a methyl group, an ethyl group, a propyl group, an isopropyl group, a n-butyl group, an isobutyl group, a tert-butyl group, and the like. Examples of the alkoxy group having 1-4 carbon atoms may include: a methoxy group, an ethoxy group, a propoxy group, an isopropoxy group, a n-butoxy group, an isobutoxy group, a tert-butoxy group, and the like.

Examples of the phenyl group which may be substituted with an alkyl group, an alkoxy group each having 1-4 carbon atoms, a nitro group or an acetyl group may include: a phenyl group, a tolyl group, a p-tert-butoxy phenyl group, a p-acetyl phenyl group, a p-nitrophenyl group, and the like. Examples of a hetero aromatic group having 3-5 carbon atoms may include: a pyridyl group, a furyl group, and the like.

Examples of the onium salt may include: tetramethyl ammonium trifluoromethane sulfonate, tetramethyl ammonium nonafluoro butane sulfonate, triethyl ammonium nonafluoro butane sulfonate, pyridinium nonafluoro butane sulfonate, triethyl ammonium camphor sulfonate, pyridinium camphor sulfonate, tetra n-butyl-ammonium nonafluoro butane sulfonate, tetraphenyl ammonium nonafluoro butane sulfonate, tetramethyl ammonium p-toluene sulfonate, diphenyl iodinium trifluoromethane sulfonate, (p-tert-butoxy phenyl)phenyl iodinium trifluoromethane sulfonate, diphenyl iodinium p-toluene sulfonate, (p-tert-butoxy phenyl)phenyl iodinium p-toluene sulfonate, triphenyl sulfonium trifluoromethane sulfonate, (p-tert-butoxy phenyl) diphenyl sulfonium trifluoromethane sulfonate, bis(p-tert-butoxy phenyl)phenyl sulfonium trifluoromethane sulfonate, tris(p-tert-butoxy phenyl) sulfonium trifluoromethane sulfonate, triphenyl sulfonium p-toluene sulfonate, (p-tert-butoxy phenyl) diphenyl sulfonium p-toluene sulfonate, bis(p-tert-butoxy phenyl)phenyl sulfonium p-toluene sulfonate, tris(p-tert-butoxy phenyl) sulfonium p-toluene sulfonate, triphenyl sulfonium nonafluoro butane sulfonate, triphenyl sulfonium butane sulfonate, trimethyl sulfonium trifluoromethane sulfonate, trimethyl sulfonium p-toluene sulfonate, cyclohexyl methyl (2-oxocyclohexyl) sulfonium trifluoromethane sulfonate, cyclohexyl methyl (2-oxo cyclohexyl) sulfonium p-toluene sulfonate, dimethyl phenyl sulfonium trifluoromethane sulfonate, dimethyl phenyl sulfonium p-toluene sulfonate, dicyclohexyl phenyl sulfonium trifluoromethane sulfonate, dicyclohexyl phenyl sulfonium p-toluene sulfonate, trinaphthylsulfonium trifluoromethane sulfonate, (2-norbornyl)methyl (2-oxocyclohexyl) sulfonium trifluoromethane sulfonate, ethylene bis[methyl (2-oxocyclopentyl) sulfonium trifluoromethane sulfonate], 1,2'-naphthyl carbonyl methyl-tetrahydro thiophenium triflate, triethyl ammonium nonaflate, tributyl ammonium nonaflate, tetraethyl ammonium nonaflate, tetrabutyl ammonium nonaflate, triethyl ammonium bis (trifluoromethylsulfonyl)imide, triethyl ammonium tris (perfluoroethylsulfonyl)methide, and the like.

Examples of a diazomethane derivative may include: bis (benzene sulfonyl)diazomethane, bis(p-toluene sulfonyl)diazomethane, bis(xylene sulfonyl)diazomethane, bis(cyclohexyl sulfonyl)diazomethane, bis(cyclopentyl sulfonyl) diazomethane, bis(n-butylsulfonyl)diazomethane, bis (isobutyl sulfonyl)diazomethane, bis(sec-butylsulfonyl) diazomethane, bis(n-propylsulfonyl)diazomethane, bis (isopropyl sulfonyl)diazomethane, bis(tert-butyl-sulfonyl) diazomethane, bis(n-amylsulfonyl)diazomethane, bis (isoamylsulfonyl)diazomethane, bis(sec-amylsulfonyl) diazomethane, bis(tert-amylsulfonyl)diazomethane, 1-cyclohexylsulfonyl-1-(tert-butyl-sulfonyl)diazomethane, 1-cyclohexyl sulfonyl-1-(tert-amyl sulfonyl)diazomethane, 1-tert-amyl sulfonyl-1-(tert-butyl-sulfonyl)diazomethane, and the like.

Examples of a glyoxime derivative may include: bis-O-(p-toluene sulfonyl)-α-dimethylglyoxime, bis-O-(p-toluene sulfonyl)-α-diphenyl glyoxime, bis-O-(p-toluene sulfonyl)-α-dicyclohexyl glyoxime, bis-O-(p-toluene sulfonyl)-2,3-pentanedione glyoxime, bis-O-(p-toluene sulfonyl)-2-methyl-3,4-pentanedione glyoxime, bis-O-(n-butane sulfonyl)-α-dimethylglyoxime, bis-O-(n-butane sulfonyl)-α-diphenyl glyoxime, bis-O-(n-butane sulfonyl)-α-dicyclohexyl glyoxime, bis-O-(n-butane sulfonyl)-2,3-pentanedione glyoxime, bis-O-(n-butane sulfonyl)-2-methyl-3,4-pentanedione glyoxime, bis-O-(methane sulfonyl)-α-dimethylglyoxime, bis-O-(trifluoromethane sulfonyl)-α-dimethylglyoxime, bis-O-(1,1,1-trifluoro ethane sulfonyl)-α-dimethylglyoxime, bis-O-(tert-butane sulfonyl)-α-dimethylglyoxime, bis-O-(perfluoro octane sulfonyl)-α-dimethylglyoxime, bis-O-(cyclohexane sulfonyl)-α-dimethylglyoxime, bis-O-(benzene sulfonyl)-α-dimethylglyoxime, bis-O-(p-fluorobenzene sulfonyl)-α-dimethylglyoxime, bis-O-(p-tert-butylbenzene sulfonyl)-α-dimethylglyoxime, bis-O-(xylene sulfonyl)-α-dimethylglyoxime, bis-O-(camphor sulfonyl)-α-dimethylglyoxime, and the like.

Examples of a bissulfone derivative may include: bis naphthyl sulfonyl methane, bis-trifluoro methyl sulfonyl methane, bis methyl sulfonyl methane, bis ethyl sulfonyl methane, bis propyl sulfonyl methane, bis isopropyl sulfonyl methane, bis-p-toluene sulfonyl methane, bis benzene sulfonyl methane, and the like.

Examples of the β-ketosulfone derivative may include: 2-cyclohexyl carbonyl-2-(p-toluene sulfonyl)propane, 2-isopropyl carbonyl-2-(p-toluene sulfonyl)propane, and the like.

Examples of the disulfone derivative may include: a diphenyl disulfone derivative, a diyclohexyl disulfone derivative, and the like.

Examples of the nitro benzyl sulfonate derivative may include: 2,6-dinitro benzyl p-toluenesulfonate, 2,4-dinitro benzyl p-toluenesulfonate, and the like.

Examples of the sulfonate derivative may include: 1,2,3-tris(methane sulfonyloxy)benzene, 1,2,3-tris(trifluoromethane sulfonyloxy)benzene, 1,2,3-tris(p-toluene sulfonyloxy)benzene, and the like.

Examples of the sulfonate derivative of N-hydroxy imide compound may include: N-hydroxy succinimide methane sulfonate, N-hydroxy succinimide trifluoromethane sulfonate, N-hydroxy succinimide ethane sulfonate, N-hydroxy succinimide 1-propane sulfonate, N-hydroxy succinimide 2-propane sulfonate, N-hydroxy succinimide 1-pentane sulfonate, N-hydroxy succinimide 1-octane sulfonate, N-hydroxy succinimide p-toluenesulfonate, N-hydroxy succinimide p-methoxybenzene sulfonate, N-hydroxy succinimide 2-chloroethane sulfonate, N-hydroxy succinimide benzenesulfonate, N-hydroxy succinimide-2,4,6-trimethyl benzene sulfonate, N-hydroxy succinimide 1-naphthalene sulfonate, N-hydroxy succinimide 2-naphthalene sulfonate, N-hydroxy-2-phenyl succinimide methane sulfonate, N-hydroxy maleimide methane sulfonate, N-hydroxy maleimide ethane sulfonate, N-hydroxy-2-phenyl maleimide methane sulfonate, N-hydroxy glutarimide methane sulfonate, N-hydroxy glutarimide benzenesulfonate, N-hydroxy phthalimide methane sulfonate, N-hydroxy phthalimide benzenesulfonate, N-hydroxy phthalimide trifluoromethane sulfonate, N-hydroxy phthalimide p-toluenesulfonate, N-hydroxy naphthalimide methane sulfonate, N-hydroxy naphthalimide benzenesulfonate, N-hydroxy-5-norbornene-2,3-dicarboxyimide methane sulfonate, N-hydroxy-5-norbornene-2,3-dicarboxyimide trifluoromethane sulfonate, N-hydroxy-5-norbornene-2,3-dicarboxyimide p-toluenesulfonate, and the like.

In particular, preferred examples of acid generators may include: an onium salt such as triphenyl sulfonium trifluoromethane sulfonate, (p-tert-butoxy phenyl) diphenyl sulfonium trifluoromethane sulfonate, tris(p-tert-butoxy phenyl) sulfonium trifluoromethane sulfonate, triphenyl sulfonium p-toluene sulfonate, (p-tert-butoxy phenyl) diphenyl sulfonium p-toluene sulfonate, tris(p-tert-butoxy phenyl) sulfonium p-toluene sulfonate, trinaphthylsulfonium trifluoromethane sulfonate, cyclohexyl methyl (2-oxocyclohexyl) sulfonium trifluoromethane sulfonate, (2-norbornyl)methyl (2-oxocyclohexyl) sulfonium trifluoromethane sulfonate, 1,2'-naphthyl carbonylmethyl tetrahydrothiophenium triflate, and the like;

a diazomethane derivative such as bis(benzene sulfonyl) diazomethane, bis(p-toluene sulfonyl)diazomethane, bis(cyclohexyl sulfonyl)diazomethane, bis(n-butylsulfonyl)diazomethane, bis(isobutyl sulfonyl)diazomethane, bis(sec-butylsulfonyl)diazomethane, bis(n-propyl sulfonyl) diazomethane, bis(isopropyl sulfonyl)diazomethane, bis (tert-butylsulfonyl)diazomethane, and the like;

a glyoxime derivative, such as bis-O-(p-toluene sulfonyl)-α-dimethylglyoxime, bis-O-(n-butane sulfonyl)-α-dimethylglyoxime, and the like;

a bissulfone derivative, such as bisnaphthyl sulfonyl methane;

a sulfonate derivative of N-hydroxyimide compounds, such as N-hydroxy succinimide methane sulfonate, N-hydroxy succinimide trifluoromethane sulfonate, N-hydroxy succinimide 1-propane sulfonate, N-hydroxy succinimide 2-propane sulfonate, N-hydroxy succinimide 1-pentane sulfonate, N-hydroxy succinimide p-toluene sulfonate, N-hydroxy naphthalimide methane sulfonate, N-hydroxy naphthalimide benzenesulfonate, and the like.

It should be noted that the acid generators mentioned above may be used alone or in admixture.

The amount of the acid generator to be added is preferably 0.1 to 50 parts, more preferably 0.5 to 40 parts to 100 parts of the base polymer. When the amount is 0.1 parts or more, there is less possibility that an amount of an acid generated is insufficient and sufficient crosslinking reactions do not occur. When the amount is 50 parts or less, there is less possibility that a mixing phenomenon occurs due to migration of acids to an overlying resist.

Furthermore, a basic compound for improving storage stability may be further added to the bottom resist layer composition according to the present invention.

The basic compound functions as a quencher that prevents an acid generated in small amounts during storage or the like from inducing crosslinking reactions.

Examples of such a basic compound may include: primary, secondary and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxyl group, nitrogen-containing compounds having a hydroxy phenyl group, nitrogen-containing alcohol compounds, amide derivatives, imide derivatives and the like.

Examples of the primary aliphatic amines may include: ammonia, methylamine, ethylamine, n-propylamine, isopropylamine, n-butylamine, isobutyl amine, sec-butyl-amine, tert-butylamine, pentylamine, tert-amylamine, cyclopentyl amine, hexylamine, cyclohexyl amine, heptylamine, octylamine, nonylamine, decyl amine, dodecylamine, cetylamine, methylene diamine, ethylenediamine, tetraethylene pentamine and the like. Examples of the secondary aliphatic amines may include: dimethylamine, diethylamine, di-n-propylamine, diisopropyl amine, di-n-butylamine, diisobutyl amine, di-sec-butylamine, dipentylamine, dicyclopentyl amine, dihexyl amine, dicyclohexyl amine, diheptylamine, dioctylamine, dinonylamine, didecylamine, didodecylamine, dicetylamine, N,N-dimethyl methylenediamine, N,N-dimethyl ethylenediamine, N,N-dimethyl tetraethylene pentamine and the like. Examples of the tertiary aliphatic amines may include: trimethylamine, triethylamine, tri-n-propylamine, triisopropyl amine, tri-n-butyl amine, triisobutyl amine, tri-sec-butyl amine, tripentyl amine, tricyclopentyl amine, trihexyl amine, tricyclohexyl amine, triheptyl amine, trioctyl amine, trinonyl amine, tridecyl amine, tridodecyl amine, tricetyl amine, N,N,N',N'-tetra methyl methylene diamine, N,N,N',N'-tetramethyl ethylenediamine, N,N,N',N'-tetramethyl tetraethylene pentamine and the like.

Moreover, examples of the mixed amines may include: a dimethyl ethylamine, methyl ethyl propyl amine, benzylamine, phenethyl amine, benzyl dimethylamine, and the like.

Examples of the aromatic amines and the heterocyclic amines may include: an aniline derivative (for example, aniline, N-methyl aniline, N-ethyl aniline, N-propyl aniline, N,N-dimethylaniline, 2-methyl aniline, 3-methyl aniline, 4-methyl aniline, ethyl aniline, propyl aniline, trimethyl aniline, 2-nitroaniline, 3-nitroaniline, 4-nitroaniline, 2,4-dinitro aniline, 2,6-dinitro aniline, 3,5-dinitro aniline, N,N-dimethyl toluidine and the like), diphenyl(p-tolyl) amine, methyl diphenylamine, triphenylamine, phenylenediamine, naphthylamine, diamino naphthalene, a pyrrole derivative (for example, pyrrole, 2H-pyrrole, 1-methylpyrrole, 2,4-dimethylpyrrole, 2,5-dimethylpyrrole, N-methylpyrrole, and the like), oxazole derivative (for example, oxazole, isoxazole and the like), a thiazole derivative (for example, thiazole, isothiazole, and the like), an imidazole derivative (for example, imidazole, 4-methyl imidazole, 4-methyl-2-phenyl imidazole and the like), a pyrazole derivative, a furazan derivative, a pyrroline derivative (for example, pyrroline, 2-methyl-1-pyrroline and the like), a pyrrolidine derivative (for example, pyrrolidine, N-methylpyrrolidine, pyrrolidinone, N-methylpyrolidone and the like), an imidazoline derivative, an imidazolidine derivative, a pyridine derivative (for example, pyridine, methylpyridine, ethyl pyridine, propyl pyridine, butyl pyridine, 4-(1-butyl pentyl)pyridine, dimethylpyridine, trimethyl pyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridine, 4-pyrrolidino pyridine, 1-methyl-4-phenylpyridine, 2-(1-ethylpropyl)pyridine, amino pyridine, dimethyl amino pyridine and the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, and the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, 1,10-phenanthroline derivative, an adenine derivative, an adenosine derivative, a guanine derivative, a guanosine derivative, an uracil derivative, an uridine derivative and the like.

Furthermore, examples of the nitrogen-containing compounds having a carboxy group may include: aminobenzoic acid, indole carboxylic acid, and an amino acid derivative (for example, nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, or methoxy alanine) and the like. Examples of the nitrogen-containing compounds having a sulfonyl group may include: 3-pyridine sulfonic acid, pyridinium p-toluene sulfonate and the like. Examples of the nitrogen-containing compounds having a hydroxyl group, the nitrogen-containing compounds having a hydroxy phenyl group, and the nitrogen-containing alcohol compounds may include: 2-hydroxy pyridine, amino cresol, 2,4-quinoline diol, 3-indole methanol hydrate, monoethanolamine, diethanolamine, triethanolamine, N-ethyl diethanolamine, N,N-diethyl ethanolamine, triisopropanol amine, 2,2'-iminodiethanol, 2-amino ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxy ethyl)pyrrolidine, 1-(2-hydroxyethyl)-2-pyrrolidinone, 3-piperidino-1,2-propanediol, 3-pyrrolidino-1,2-propanediol, 8-hydroxy julolidine, 3-quinuclidinol, 3-tropanol, 1-methyl-2-pyrrolidine ethanol, 1-aziridine ethanol, N-(2-hydroxyethyl) phthalimide, N-(2-hydroxyethyl) isonicotinamide, and the like.

Examples of the amide derivatives may include: formamide, N-methyl formamide, N,N-dimethylformamide, acetamide, N-methyl acetamide, N,N-dimethylacetamide, propione amide, benzamide, and the like.

Examples of the imide derivatives may include: phthalimide, succinimide, maleimide, and the like.

The amount of addition of the basic compound is preferably 0.001 to 2 parts, and in particular, 0.01 to 1 part to 100 parts of all the base polymers. When the amount is 0.001 parts or more, sufficient effects of adding the compound are obtained. When the amount is 2 parts or less, there is less possibility that the compound traps all acids generated by heat and thus no crosslinking reactions occur.

As the organic solvent that may be added to the bottom resist layer composition according to the present invention, any organic solvent that dissolves the base polymer, an acid generator, a crosslinker and other additives may be used. Examples of such an organic solvent may include: ketones such as cyclohexanone, methyl-2-n-amyl ketone; alcohols such as 3-methoxy butanol, 3-methyl-3-methoxy butanol, 1-methoxy-2-propanol, 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, or diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono methyl ether acetate, or propylene glycol mono tert-butyl ether acetate. Above solvents may be used alone or in admixture. However, the organic solvent that may be added to the bottom resist layer composition according to the present invention is not restricted to the above solvents.

In the bottom resist layer composition according to the present invention, among the organic solvents, diethylene glycol dimethyl ether, 1-ethoxy-2-propanol, ethyl lactate, propylene glycol monomethyl ether acetate, or a mixture thereof are preferably used.

The amount of the organic solvent to be added is preferably 200 to 10,000 parts, and more preferably 300 to 5,000 parts to 100 parts of all the base polymers.

The present invention provides a patterning process for patterning a substrate by lithography wherein, at least, a bottom resist layer is formed on a substrate with the bottom resist layer composition according to the present invention; a top resist layer is formed on the bottom resist layer with a top resist layer composition of a photoresist composition, to form a bilayer resist film; a pattern circuit area of the top resist layer is exposed and then developed with a developer to form a resist pattern on the top resist layer; the bottom resist layer is etched using as a mask the top resist layer on which the pattern is formed; and then the substrate is etched using as a mask at least the bottom resist layer on which the pattern is formed, to form the pattern on the substrate.

The present invention also provides a patterning process for patterning a substrate by lithography wherein, at least, a bottom resist layer is formed on a substrate with the bottom resist layer composition according to the present invention; an intermediate resist layer is formed on the bottom resist layer by using an intermediate resist layer composition containing silicon atoms; a top resist layer is formed on the intermediate resist layer by using a top resist layer composition of a photoresist composition, to form a trilayer resist film; a pattern circuit area of the top resist layer is exposed and then developed with a developer to form a resist pattern on the top resist layer; the intermediate resist layer is etched using as a mask the top resist layer on which the pattern is formed; the bottom resist layer is etched using as a mask at least the intermediate resist layer on which the pattern is formed; and then the substrate is etched using as a mask at least the bottom resist layer on which the pattern is formed, to form the pattern on the substrate.

Figure 6:
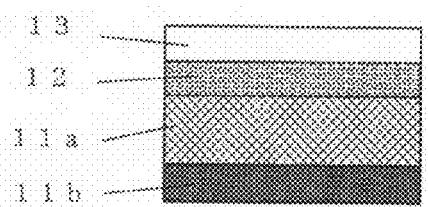
FIG. 6 is an explanatory view of a bilayer resist process.
Figure 6:
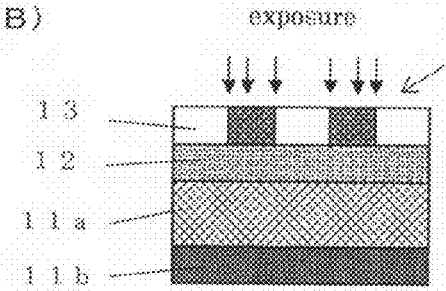
Figure 6:
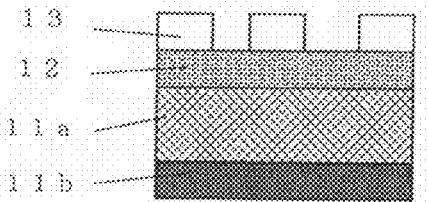
Figure 6:
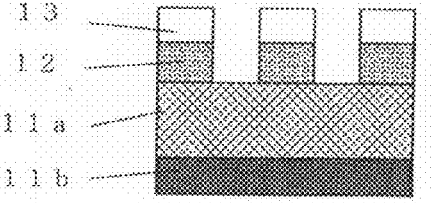
Figure 6:
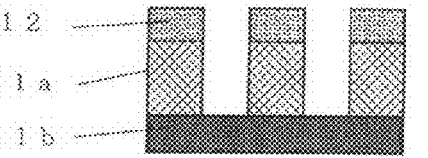

Hereinafter, patterning processes according to the present invention will be explained with reference to FIGS. 6 and 7. FIG. 6 is an explanatory view of an embodiment of a bilayer resist process and FIG. 7 is an explanatory view of an embodiment of a trilayer resist process.

As shown in FIGS. 6 and 7, a substrate to be patterned 11 may consist of a layer to be processed 11a and a base layer 11b. The base layer 11b of the substrate 11 is not limited and may be Si, an amorphous silicon (α-Si), p-Si, $SiO_2$, SiN, SiON, W, TiN, Al, or the like. The base layer 11b may be a material different from the layer to be processed 11a may be used. The layer to be processed 11a may be made of Si, $SiO_2$, SiON, SiN, p-Si, α-Si, W, W—Si, Al, Cu, Al—Si, or the like; various low dielectric constant films, or etching stopper films. Typically, the layer 11a may be formed at a thickness of 50 to 10,000 nm, in particular at a thickness of 100 to 5,000 nm.

First, a bilayer resist process in FIG. 6 is explained.

As shown in FIG. 6(A), a bottom resist layer 12 is formed with a bottom resist layer composition according to the present invention on the substrate 11. On the bottom resist layer 12, a top resist layer 13 is formed with a top resist layer composition of a photoresist composition. Thus a bilayer resist film is formed.

The bottom resist layer 12 may be formed on the substrate 11 by spin-coating method or the like as with standard procedures of forming photoresist films. The bottom resist layer 12 is formed by spin-coating method or the like, and then an organic solvent is evaporated. In order to prevent the formed bottom resist layer 12 from mixing with the top resist layer 13, the bottom resist layer 12 is desirably baked to promote crosslinking reactions. The baking is preferably carried out at a temperature in the range of 80 to 300° C. for 10 to 300 seconds. Thickness of the bottom resist layer 12 may be selected appropriately. Preferred thickness of the bottom resist layer 12 is 100 to 20,000 nm, in particular, 150 to 15,000 nm.

The photoresist composition for forming the top resist layer 13 may be photoresist compositions known in the art. In view of etching resistance against oxygen gas and the like, there may be used a positive photoresist composition or the like that contains a polymer containing silicon atoms such as a polysilsesquioxane derivative or a vinylsilane derivative as a base polymer; and optionally further contains an organic solvent, an acid generator, and a basic compound and the like. As the polymer containing silicon atoms, polymers known in the art that are used for these kinds of resist compositions may be used.

Thickness of the top resist layer 13 is not particularly restricted. This thickness is preferably 30 to 500 nm, in particular, 50 to 400 nm.

When the top resist layer 13 is formed with a top resist layer composition of a photoresist composition, spin-coating method or the like is preferably used as with the case of forming the bottom resist layer 12. After the top resist layer 13 is formed by spin-coating method or the like, the top resist layer 13 is prebaked. This prebaking is preferably conducted at 80 to 180° C. for 10 to 300 seconds.

Then a pattern circuit area of the top resist layer is exposed according to standard procedures (see FIG. 6 (B)). Subsequently, post exposure baking (PEB) and development are carried out to obtain a resist pattern (see FIG. 6 (C)). In FIG. 6(B), the reference number 13' denotes an exposed area.

The development may be carried out by puddle method, dip method, or the like using an alkaline solution. In particular, puddle method is preferably carried out using a 2.38% by mass aqueous solution of tetramethylammonium hydroxide at room temperature for 10 to 300 seconds. Then, the top resist layer is rinsed with pure water, and dried by spin dry, nitrogen blow, or the like.

Then, as shown in FIG. 6(D), the bottom resist layer 12 is etched with an etching gas mainly containing oxygen gas or hydrogen gas and by using as a mask the top resist layer on which a resist pattern is formed.

This etching may be conducted with standard procedures. In the case of dry etching with an etching gas mainly containing oxygen gas, it is also possible to add an inert gas such as He or Ar; and/or a gas such as CO, $CO_2$, $NH_3$, $SO_2$, $N_2$, or $NO_2$ in addition to the oxygen gas. In particular, the gas such as CO, $CO_2$, $NH_3$, $SO_2$, $N_2$, or $NO_2$ is used to protect sidewalls and not to cause undercut of pattern sidewalls.

Next, as shown in FIG. 6(E), the substrate 11 is etched by using as a mask at least the patterned bottom resist layer 12 to pattern the substrate 11.

This etching of the substrate 11 may be conducted with standard procedures. When the substrate is $SiO_2$ or SiN, the etching is conducted with gas mainly containing fluorocarbon gas. When the substrate is poly silicon (p-Si), Al or W, the etching is conducted with gas mainly containing chlorine gas or bromine gas. The bottom resist layer composition according to the present invention has an advantage of exhibiting excellent etching resistance on etching of substrates. As for etching of a substrate, the top resist layer may be stripped and then the substrate may be etched. Or, the substrate may be etched without stripping the top resist layer. Whether the top resist layer is stripped before etching of a substrate or not depends on circumstances.

Next, a trilayer resist process in FIG. 7 is explained.

As shown in FIG. 7(A), a bottom resist layer 12 is formed with a bottom resist layer composition according to the present invention on a substrate 11. On the bottom resist layer 12, an intermediate resist layer 14 is formed by using an intermediate resist layer composition containing silicon atoms. On the intermediate resist layer 14, a top resist layer 13 is formed by using a top resist layer composition of a photoresist composition. Thus a trilayer resist film is formed.

As mentioned above, the intermediate resist layer 14 containing silicon atoms is interposed between the bottom resist layer 12 and the top resist layer 13 in the trilayer resist process. In this case, examples of the composition for forming the intermediate resist layer 14 may include polysilsesquioxane-based silicone polymer, tetraorthosilicate glass (TEOS), and the like. Then films prepared by spin-coating such a composition, or a film of $SiO_2$, SiN, or SiON prepared by CVD may be used as the intermediate resist layer 14.

Preferred thickness of the intermediate resist layer 14 is 10 to 1,000 nm.

Furthermore, the top resist layer composition of a photoresist composition preferably comprises a polymer without a silicon atom. A top resist layer comprising a polymer without a silicon atom has an advantage of providing superior resolution to a top resist layer comprising a polymer containing silicon atoms.

Other configuration is the same as the bilayer resist process in FIG. 6.

Then in the same fashion as the bilayer resist process in FIG. 6, a pattern circuit area of the top resist layer is exposed according to standard procedures (see FIG. 7 (B)). Subsequently, post exposure baking (PEB) and development are carried out to obtain a resist pattern (see FIG. 7 (C)). In FIG. 7(B), the reference number 13' denotes an exposed area.

Then, as shown in FIG. 7(D), the intermediate resist layer 14 is etched by dry etching or the like with an etching gas mainly containing flon gas and by using the top resist layer 13 on which a resist pattern is formed as a mask.

This etching may be conducted by standard procedures. In the case of conducting dry etching with an etching gas mainly containing flon gas, $CF_4$, $CHF_3$, $C_2F_6$, $C_3F_8$, $C_4F_{10}$, or the like may be typically used.

Next, after the intermediate resist layer 14 is etched, as shown in FIG. 7(E), the bottom resist layer 12 is etched by dry etching or the like with an etching gas mainly containing $O_2$ (oxygen gas) or $H_2$ (hydrogen gas) and by using at least the patterned intermediate resist layer 14 as a mask. In this case, it is also possible to add an inert gas such as He or Ar; and/or a gas such as CO, $CO_2$, $NH_3$, $SO_2$, $N_2$, or $NO_2$ in addition to the $O_2$ or $H_2$ gas. In particular, the gas such as CO, $CO_2$, $NH_3$, $SO_2$, $N_2$, or $NO_2$ is used to protect sidewalls and not to cause undercut of pattern sidewalls.

Next, as shown in FIG. 7(F), the substrate 11 is etched by using as a mask at least the patterned bottom resist layer 12 to pattern the substrate 11.

This etching of the substrate 11 may be conducted with standard procedures. In the same manner as with the bilayer resist process in FIG. 6, when the substrate is made of $SiO_2$ or SiN, the etching is conducted with gas mainly containing fluocarbon gas. When the substrate is made of poly silicon (p-Si), Al or W, the etching is conducted with gas mainly containing chlorine gas or bromine gas. The bottom resist layer composition according to the present invention has an advantage of exhibiting excellent etching resistance on etching of substrates. As for etching of a substrate, the intermediate resist layer and the like may be stripped and then the substrate may be etched. Or, the substrate may be etched without stripping the intermediate resist layer and the like. Whether the intermediate resist layer and the like is stripped before etching of a substrate or not depends on circumstances.

EXAMPLES

Hereafter the present invention will be explained in detail with reference to Examples and Comparative Examples. However, the present invention is not limited thereto.

Synthetic Example 1

To a 200 mL flask were added 6.1 g of 2,5-norbornadiene-2-hydroxymethyl, 4.6 g of 2,5-norbornadiene and 10 g of toluene as a solvent. This reaction vessel was cooled to −70° C. under nitrogen atmosphere, and then degasing under reduced pressure and nitrogen blowing were repeated 3 times. After the temperature was elevated to room temperature, 2.4 g of AIBN was added as a polymerization initiator, then the temperature was elevated to 80° C. and a reaction was conducted for 24 hours. This reaction solution was concentrated to half, and precipitated in a mixed solution of 300 mL of methanol and 50 mL of water. Thus obtained white solid was filtered, dried under a reduced pressure at 60° C. to obtain a white polymer.

The obtained polymer was analyzed by $^{13}C$, $^{1}H$-NMR and GPC measurement, and the following results were obtained.

Copolymerization ratio (mole ratio)
2,5-norbornadiene-2-hydroxymethyl: 2,5-norbornadiene=0.5:0.5
Weight-average molecular weight (Mw)=6,800
Molecular-weight distribution (Mw/Mn)=1.66
This polymer is defined as Polymer 1.

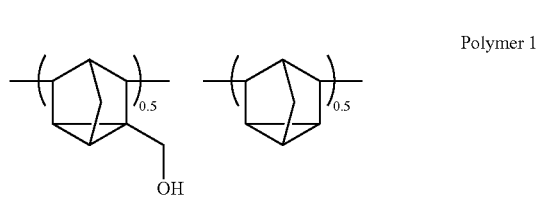

Polymer 1

Synthetic Example 2

To a 200 mL flask were added 5.4 g of 2,5-norbornadiene-2-carboxylic acid, 5.5 g of 2,5-norbornadiene and 10 g of toluene as a solvent. This reaction vessel was cooled to −70° C. under nitrogen atmosphere, and then degasing under reduced pressure and nitrogen blowing were repeated 3 times. After the temperature was elevated to room temperature, 2.4 g of AIBN was added as a polymerization initiator, then the temperature was elevated to 80° C. and a reaction was conducted for 24 hours. This reaction solution was concentrated to half, and precipitated in a mixed solution of 300 mL of methanol and 50 mL of water. Thus obtained white solid was filtered, dried under a reduced pressure at 60° C. to obtain a white polymer.

The obtained polymer was analyzed by $^{13}C$, $^{1}H$-NMR and GPC measurement, and the following results were obtained.

Copolymerization ratio (mole ratio)
2,5-norbornadiene-2-carboxylic acid: 2,5-norbornadiene=0.4:0.6
Weight-average molecular weight (Mw)=6,400
Molecular-weight distribution (Mw/Mn)=1.81
This polymer is defined as Polymer 2.

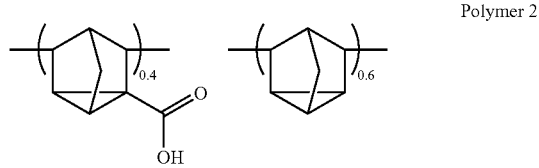

Polymer 2

Synthetic Example 3

To a 200 mL flask were added 8.5 g of 2,5-norbornadiene-2-carboxylic acid, 4.3 g of indene and 10 g of toluene as a solvent. This reaction vessel was cooled to −70° C. under nitrogen atmosphere, and then degasing under reduced pressure and nitrogen blowing were repeated 3 times. After the temperature was elevated to room temperature, 2.4 g of AIBN was added as a polymerization initiator, then the temperature was elevated to 80° C. and a reaction was conducted for 24 hours. This reaction solution was concentrated to half, and precipitated in a mixed solution of 300 mL of methanol and 50 mL of water. Thus obtained white solid was filtered, dried under a reduced pressure at 60° C. to obtain a white polymer.

The obtained polymer was analyzed by $^{13}C$, $^{1}H$-NMR and GPC measurement, and the following results were obtained.

Copolymerization ratio (mole ratio)
2,5-norbornadiene-2-carboxylic acid indene=0.7:0.3
Weight-average molecular weight (Mw)=5,400
Molecular-weight distribution (Mw/Mn)=1.68
This polymer is defined as Polymer 3.

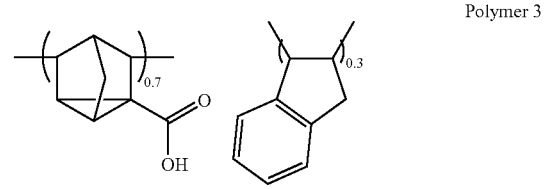

Polymer 3

Synthetic Example 4

To a 200 mL flask were added 8.5 g of 2,5-norbornadiene-2-carboxylic acid, 6.9 g of acenaphthylene and 10 g of toluene as a solvent. This reaction vessel was cooled to −70° C. under nitrogen atmosphere, and then degasing under reduced pressure and nitrogen blowing were repeated 3 times. After the temperature was elevated to room temperature, 2.4 g of AIBN was added as a polymerization initiator, then the temperature was elevated to 80° C. and a reaction was conducted for 24 hours. This reaction solution was concentrated to half, and precipitated in a mixed solution of 300 mL of methanol and 50 mL of water. Thus obtained white solid was filtered, dried under a reduced pressure at 60° C. to obtain a white polymer.

The obtained polymer was analyzed by $^{13}C$, $^{1}H$-NMR and GPC measurement, and the following results were obtained.

Copolymerization ratio (mole ratio)
2,5-norbornadiene-2-carboxylic acid:acenaphthylene=0.7:0.3
Weight-average molecular weight (Mw) 4,400
Molecular-weight distribution (Mw/Mn)=1.52
This polymer is defined as Polymer 4.

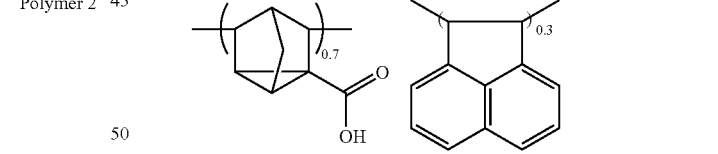

Polymer 4

Synthetic Example 5

To a 200 mL flask were added 8.5 g of 2,5-norbornadiene-2-carboxylic acid, 3.1 g of styrene and 10 g of toluene as a solvent. This reaction vessel was cooled to −70° C. under nitrogen atmosphere, and then degasing under reduced pressure and nitrogen blowing were repeated 3 times. After the temperature was elevated to room temperature, 2.4 g of AIBN was added as a polymerization initiator, then the temperature was elevated to 80° C. and a reaction was conducted for 24 hours. This reaction solution was concentrated to half, and precipitated in a mixed solution of 300 mL of methanol and 50 mL of water. Thus obtained white solid was filtered, dried under a reduced pressure at 60° C. to obtain a white polymer.

The obtained polymer was analyzed by $^{13}C$, $^{1}H$-NMR and GPC measurement, and the following results were obtained.
Copolymerization ratio (mole ratio)
2,5-norbornadiene-2-carboxylic acid:styrene 0.7:0.3
Weight-average molecular weight (Mw)=8,400
Molecular-weight distribution (Mw/Mn)=1.89
This polymer is defined as Polymer 5.

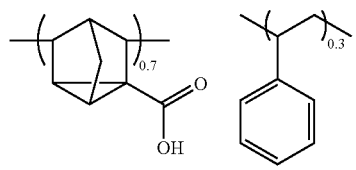

Polymer 5

Synthetic Example 6

To a 200 mL flask were added 8.5 g of 2,5-norbornadiene-2-carboxylic acid, 6.1 g of 9-vinylphenanthrene and 10 g of toluene as a solvent. This reaction vessel was cooled to −70° C. under nitrogen atmosphere, and then degasing under reduced pressure and nitrogen blowing were repeated 3 times. After the temperature was elevated to room temperature, 2.4 g of AIBN was added as a polymerization initiator, then the temperature was elevated to 80° C. and a reaction was conducted for 24 hours. This reaction solution was concentrated to half, and precipitated in a mixed solution of 300 mL of methanol and 50 mL of water. Thus obtained white solid was filtered, dried under a reduced pressure at 60° C. to obtain a white polymer.

The obtained polymer was analyzed by $^{13}C$, $^{1}H$-NMR and GPC measurement, and the following results were obtained.
Copolymerization ratio (mole ratio)
2,5-norbornadiene-2-carboxylic acid:9-vinylphenanthrene=0.7:0.3
Weight-average molecular weight (Mw)=8,300
Molecular-weight distribution (Mw/Mn)=1.78
This polymer is defined as Polymer 6.

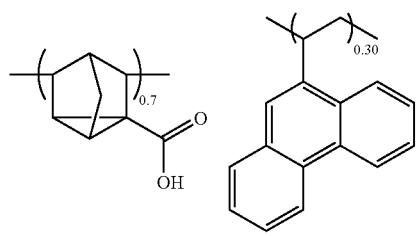

Polymer 6

Synthetic Example 7

To a 200 mL flask were added 8.5 g of 2,5-norbornadiene-2-hydroxymethyl, 3.5 g of indene and 20 g of 1,2-dichloroethane as a solvent. To this reaction vessel under nitrogen atmosphere was added 1 g of trifluoroboron as a polymerization initiator. Then the temperature was elevated to 60° C. and a reaction was conducted for 15 hours. This reaction solution was concentrated to half, and precipitated in a mixed solution of 1.5 L of methanol and 0.2 L of water. Thus obtained white solid was filtered, dried under a reduced pressure at 60° C. to obtain a white polymer.

The obtained polymer was analyzed by $^{13}C$, $^{1}H$-NMR and GPC measurement, and the following results were obtained.
Copolymerization ratio (mole ratio)
2,5-norbornadiene-2-hydroxymethyl:indene=0.7:0.3
Weight-average molecular weight (Mw)=5,400
Molecular-weight distribution (Mw/Mn)=1.63
This polymer is defined as Polymer 7.

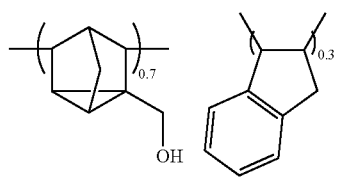

Polymer 7

Synthetic Example 8

To a 200 mL flask were added 8.2 g of 2,5-norbornadiene-2-hydroxy, 3.5 g of indene and 20 g of 1,2-dichloroethane as a solvent. To this reaction vessel under nitrogen atmosphere was added 1 g of trifluoroboron as a polymerization initiator. Then the temperature was elevated to 60° C. and a reaction was conducted for 15 hours. This reaction solution was concentrated to half, and precipitated in a mixed solution of 1.5 L of methanol and 0.2 L of water. Thus obtained white solid was filtered, dried under a reduced pressure at 60° C. to obtain a white polymer.

The obtained polymer was analyzed by $^{13}C$, $^{1}H$-NMR and GPC measurement, and the following results were obtained.
Copolymerization ratio (mole ratio)
2,5-norbornadiene-2-hydroxy:indene=0.7:0.3
Weight-average molecular weight (Mw)=3,400
Molecular-weight distribution (Mw/Mn)=1.65
This polymer is defined as Polymer 8.

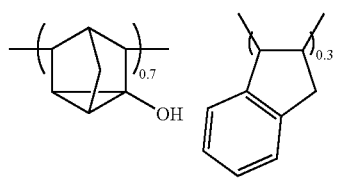

Polymer 8

Comparative Synthetic Example 1

To a 500 mL flask were added 40 g of 4-hydroxystyrene, 160 g of 1-adamantane 2-methacrylate and 40 g of toluene as a solvent. This reaction vessel was cooled to −70° C. under nitrogen atmosphere, and then degasing under reduced pressure and nitrogen blowing were repeated 3 times. After the temperature was elevated to room temperature, 4.1 g of AIBN was added as a polymerization initiator, then the temperature was elevated to 80° C. and a reaction was conducted for 24 hours. This reaction solution was concentrated to half, and precipitated in a mixed solution of 300 mL of methanol and 50 mL of water. Thus obtained white solid was filtered, dried under a reduced pressure at 60° C. to obtain 188 g of a white polymer.

The obtained polymer was analyzed by $^{13}C$, $^1H$-NMR and GPC measurement, and the following results were obtained.

Copolymerization ratio (mole ratio)

4-hydroxystyrene:1-adamantane 2-methacrylate=0.32: 0.68

Weight-average molecular weight (Mw)=10,900

Molecular-weight distribution (Mw/Mn)=1.77

This polymer is defined as Comparative Polymer 1.

Comparative Polymer 1

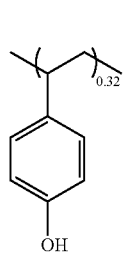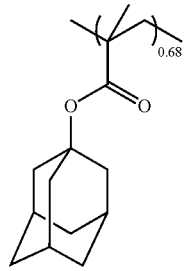

Examples, Comparative Examples

Preparation of Bottom Resist Layer Compositions

Bottom resist layer compositions (Examples 1 to 16, and Comparative Examples 1 and 2) were prepared respectively by dissolving the polymers (resins) represented by Polymers 1 to 8, the polymer (resin) represented by Comparative Polymer 1, Comparative Polymer 2 (creosol-novolac resin, m:p=0.4:0.6, Mw=8000, Mw/Mn=4.5), the following blending oligomer 1, the following blending phenolic ballast compounds 1 to 3, the following acid generators AG1 to AG3 and the following crosslinkers CR1 and CR2 at ratios shown in Table 1 in an organic solvent containing 0.1% by mass of FC-430 (manufactured by Sumitomo 3M), and filtering them with a 0.1 μm filter made of fluoroplastics.

Each of the compositions in Table 1 is as follows.

Polymers 1 to 8: Polymers Obtained in the Synthetic Examples 1 to 8

Comparative Polymer 1: Obtained in the Comparative Example 1

Comparative Polymer 2: the Creosol-Novolac Resin Mentioned Above

Blending Oligomer 1 (See the Following Structural Formula)

Blending Oligomer 1

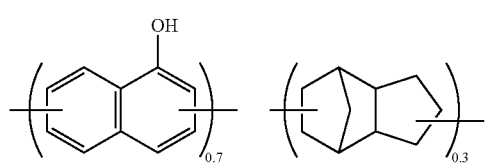

Mw = 970, Mw/Mn = 4.5

Blending phenolic ballast compounds 1 to 3 (see the following structural formulae)

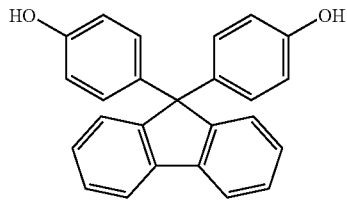

Blending phenolic ballast compound 1

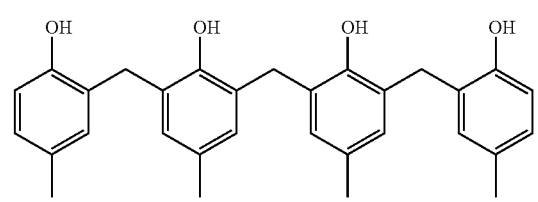

Blending phenolic ballast compound 2

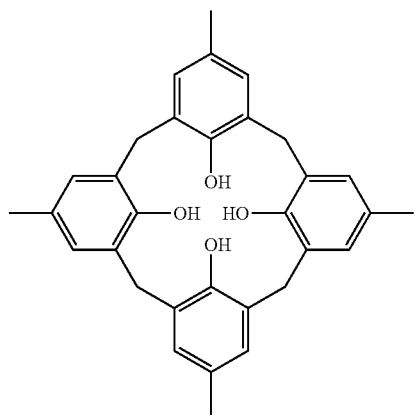

Blending phenolic ballast compound 3

Acid generators: AG1, AG2 and AG3 (see the following structural formulae)

AG1

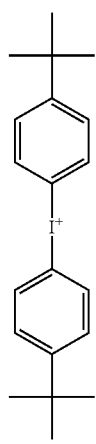

$CF_3CF_2CF_2CF_2SO_3^-$

-continued

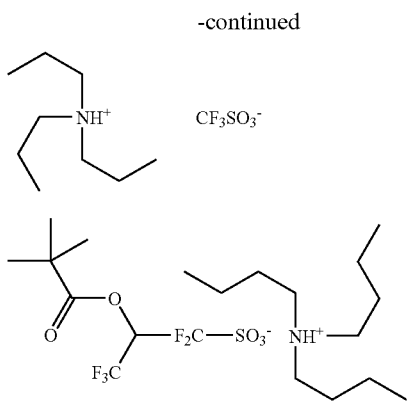
AG2

AG3

Crosslinkers: CR1 and CR2 (see the following structural formulae)

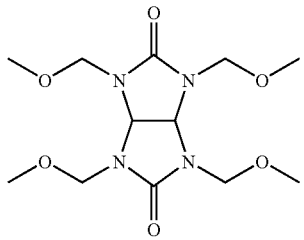
CR1

-continued

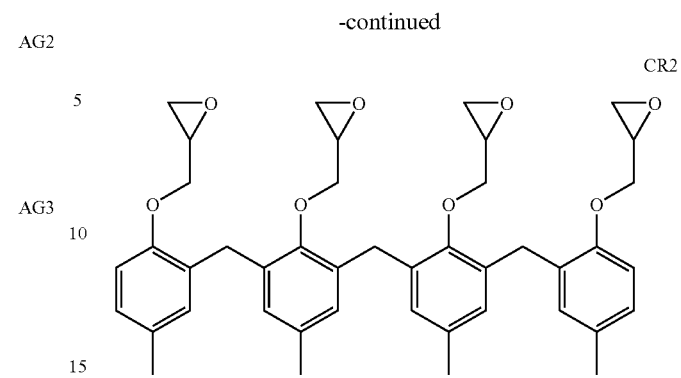
CR2

Organic solvent: PGMEA (propylene glycol monomethyl ether acetate)

Each of the bottom resist layer compositions (Examples 1 to 16, Comparative Examples 1 and 2) prepared above was applied onto a silicon substrate, and baked for 60 seconds at 200° C. to form a bottom resist layer with a thickness of 500 nm.

After the bottom resist layers were formed, the refractive indexes (n, k) of the bottom resist layers at a wavelength of 193 nm were measured using an incident light angle variable spectroscopic ellipsometer (VASE) manufactured by J.A. Woollam Co., Inc. The results are shown in Table 1.

TABLE 1

| No. | Polymer (parts by mass) | Crosslinker (parts by mass) | Acid Generator (parts by mass) | Organic Solvent (parts by mass) | Refractive Index (193 nm) | |
|---|---|---|---|---|---|---|
| | | | | | n value | k value |
| Example 1 | Polymer 1 (20.0) Blending phenolic ballast compound 1 (10.0) | CR1 (4) | AG1 (1) | PGMEA (100) | 1.70 | 0.25 |
| Example 2 | Polymer 2 (28.0) Blending phenolic ballast compound 1 (10.0) | CR1 (4) | AG1 (1) | PGMEA (100) | 1.71 | 0.26 |
| Example 3 | Polymer 3 (28.0) | CR1 (4) | AG1 (1) | PGMEA (100) | 1.68 | 0.25 |
| Example 4 | Polymer 4 (22.0) Blending phenolic ballast compound 1 (7.0) | CR1 (4) | AG1 (1) | PGMEA (100) | 1.70 | 0.25 |
| Example 5 | Polymer 5 (28.0) | CR1 (4) | AG1 (1) | PGMEA (100) | 1.71 | 0.28 |
| Example 6 | Polymer 6 (28.0) | CR1 (4) | AG1 (1) | PGMEA (100) | 1.70 | 0.22 |
| Example 7 | Polymer 2 (28.0) Blending phenolic ballast compound 1 (10.0) | — | AG1 (1) | PGMEA (100) | 1.71 | 0.26 |
| Example 8 | Polymer 2 (28.0) Blending phenolic ballast compound 2 (10.0) | CR1 (4) | AG1 (1) | PGMEA (100) | 1.71 | 0.26 |
| Example 9 | Polymer 2 (28.0) Blending phenolic ballast compound 3 (10.0) | CR1 (4) | AG1 (1) | PGMEA (100) | 1.71 | 0.28 |

TABLE 1-continued

| No. | Polymer (parts by mass) | Crosslinker (parts by mass) | Acid Generator (parts by mass) | Organic Solvent (parts by mass) | Refractive Index (193 nm) | |
|---|---|---|---|---|---|---|
| | | | | | n value | k value |
| Example 10 | Polymer 3 (20.0) Blending Oligomer 1 (10) | CR1 (4) | AG1 (1) | PGMEA (100) | 1.70 | 0.24 |
| Example 11 | Polymer 3 (20.0) Blending phenolic ballast compound 3 (10.0) | CR1 (4) | AG1 (1) | PGMEA (100) | 1.66 | 0.35 |
| Example 12 | Polymer 1 (20.0) | CR2 (10) | AG1 (1) | PGMEA (100) | 1.69 | 0.26 |
| Example 13 | Polymer 2 (28.0) Blending phenolic ballast compound 1 (10.0) | CR1 (4) | AG2 (1) | PGMEA (100) | 1.71 | 0.26 |
| Example 14 | Polymer 2 (28.0) Blending phenolic ballast compound 1 (10.0) | CR1 (4) | AG3 (1) | PGMEA (100) | 1.71 | 0.26 |
| Example 15 | Polymer 7 (28.0) | CR1 (4) | AG1 (1) | PGMEA (100) | 1.66 | 0.30 |
| Example 16 | Polymer 8 (28.0) | CR1 (4) | AG1 (1) | PGMEA (100) | 1.68 | 0.32 |
| Comparative Example 1 | Comparative Polymer 1 (22.0) | CR1 (4) | AG1 (1) | PGMEA (100) | 1.70 | 0.22 |
| Comparative Example 2 | Comparative Polymer 2 (22.0) | CR1 (4) | AG1 (1) | PGMEA (100) | 1.32 | 0.68 |

As shown in Table 1, the bottom resist layers in the Examples 1 to 16 have n values of refractive index in the range of 1.6 to 1.8, and k values of refractive index in the range of 0.20 to 0.35. Thus the bottom resist layers have sufficient antireflection effects as bottom resist layers for bilayer resist and trilayer resist. The bottom resist layers have optimum refractive indexes (n values) and optimum extinction coefficients (k values) that provide sufficient antireflection effects in particular when the bottom resist layers have thicknesses of 200 nm or more.

[Tests of Etching Resistance of Bottom Resist Layers]

Next, tests of dry etching resistance of bottom resist layers were conducted. First, bottom resist layers (Examples 1 to 16, Comparative Examples 1 and 2) as with those used in the measurements of refractive indexes were formed. Then etching tests of these bottom layers with $CF_4/CHF_3$ gas were conducted using the following conditions (1). In the tests, a dry-etching-system TE-8500P manufactured by Tokyo Electron, Ltd. was used. Then a difference of a thickness of each bottom resist layer before and after etching was determined. The results are shown in the following Table 2.

(1) Etching Tests with $CF_4/CHF_3$ Gas

Etching conditions are shown below.

Chamber pressure: 40.0 Pa

RF power: 1,000 w

Gap: 9 mm $CHF_3$ gas flow rate: 30 ml/min $CF_4$ gas flow rate: 30 ml/min

Ar gas flow rate: 100 ml/min

Time: 60 sec

TABLE 2

| Bottom Resist Layer | Etching Rate with $CF_4/CHF_3$ gas (nm/min) |
|---|---|
| Example 1 | 92 |
| Example 2 | 98 |
| Example 3 | 92 |
| Example 4 | 90 |
| Example 5 | 98 |
| Example 6 | 92 |
| Example 7 | 98 |
| Example 8 | 99 |
| Example 9 | 100 |
| Example 10 | 94 |
| Example 11 | 94 |
| Example 12 | 93 |
| Example 13 | 98 |
| Example 14 | 98 |
| Example 15 | 92 |
| Example 16 | 91 |
| Comparative Example 1 | 144 |
| Comparative Example 2 | 127 |

Furthermore, the bottom resist layers (Examples 1 to 16, Comparative Examples 1 and 2) were subjected to etching tests with $Cl_2/BCl_3$ gas under the following conditions (2). In the tests, a dry-etching-system L-507D-L manufactured by Nichiden ANELVA Corporation was used. Then a difference of a thickness of each bottom resist layer before and after etching was determined. The results are shown in the following Table 3.

(2) Etching Tests with $Cl_2/BCl_3$ Gas

Etching conditions are shown below.

Chamber pressure: 40.0 Pa

RF power: 300 W

Gap: 9 mm $Cl_2$ gas flow rate: 30 ml/min $BCl_3$ gas flow rate: 30 ml/min $CHF_3$ gas flow rate: 100 ml/min $O_2$ gas flow rate: 2 ml/min Time: 60 sec

TABLE 3

| Bottom Resist Layer | Etching Rate with $Cl_2/BCl_3$ gas (nm/min) |
|---|---|
| Example 1 | 102 |
| Example 2 | 108 |
| Example 3 | 99 |
| Example 4 | 96 |
| Example 5 | 103 |
| Example 6 | 99 |
| Example 7 | 110 |
| Example 8 | 108 |
| Example 9 | 116 |
| Example 10 | 102 |
| Example 11 | 103 |
| Example 12 | 108 |
| Example 13 | 105 |
| Example 14 | 103 |
| Example 15 | 98 |
| Example 16 | 97 |
| Comparative Example 1 | 166 |
| Comparative Example 2 | 131 |

As shown in Tables 2 and 3, etching rates of bottom resist layers according to the present invention with $CF_4/CHF_3$ gas and with $Cl_2/BCl_3$ gas are sufficiently slower than those of the Comparative Examples 1 and 2. Therefore, it has been established that the bottom resist layers according to the present invention have excellent etching resistance under conditions of etching substrates.

[Preparation of Top Resist Layer Composition]

"ArF SL resist" (top resist layer composition) was prepared by dissolving ArF single layer resist polymer 1, PAG, and Amine at ratios shown in Table 4 in a solvent containing 0.1% by mass of FC-430 (manufactured by Sumitomo 3M), and filtering this solution with a 0.1 μm filter made of fluoroplastics.

Each of the compositions in Table 4 is as follows. ArF single layer resist polymer 1 (see the following structural formula)

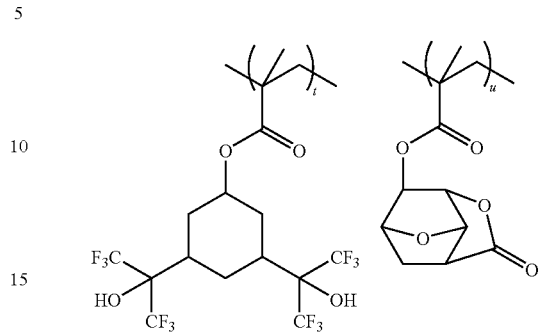

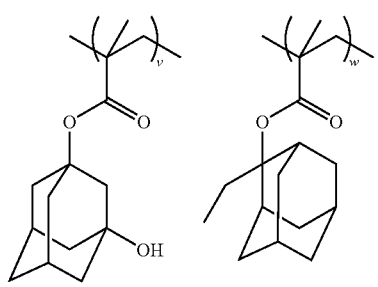

ArF single layer resist polymer 1
(t = 0.10, u = 0.30, v = 0.30, w = 0.30 Mw 7,600)

Basic Compound Amine (see the following structural formula)

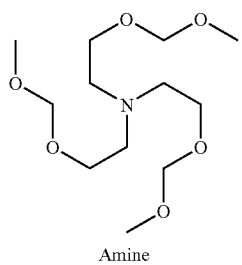

Amine

Acid generator: PAG1 (see the following structural formula)

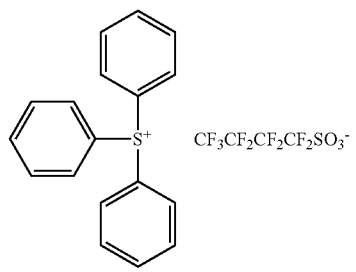

PAG1

Solvent: PGMEA

TABLE 4

| | Polymer (parts by mass) | Acid Generator (parts by mass) | Basic Compound (parts by mass) | Solvent (parts by mass) |
|---|---|---|---|---|
| ArF SL resist | ArF single layer resist polymer 1 (100) | PAG1 (4.4) | Amine (0.5) | PGMEA (1,500) |

[Preparation of Intermediate Resist Layer Composition]

"ArF Si-containing intermediate layer composition SOG" (intermediate resist layer composition) was prepared by dissolving ArF silicon-containing intermediate layer polymer 1 and AG1 at ratios shown in Table 5 in a solvent containing 0.1% by mass of FC-430 (manufactured by Sumitomo 3M), and filtering this solution with a 0.1 μm filter made of fluoroplastics.

Each of the compositions in Table 5 is as follows. ArF silicon-containing intermediate layer polymer 1 (see the following structural formula)

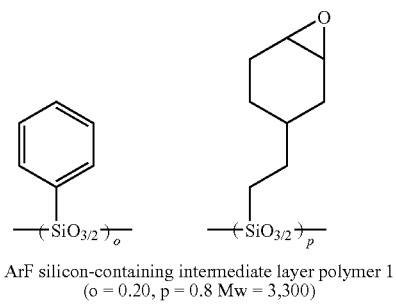

ArF silicon-containing intermediate layer polymer 1
(o = 0.20, p = 0.8 Mw = 3,300)

Acid generator: AG1 (see the structural formula mentioned above)

Solvent: PGMEA

TABLE 5

| | Polymer (parts by mass) | Acid Generator (parts by mass) | Crosslinker | Solvent (parts by mass) |
|---|---|---|---|---|
| ArF Si-containing intermediate layer composition (SOG) | ArF silicon-containing intermediate layer polymer 1 (100) | AG1 (2.0) | — | PGMEA (2,500) |

[Observation of Pattern Profile]

Each of solutions of the bottom resist layer compositions (Examples 1 to 16, Comparative Examples 1 and 2) prepared above were applied on a substrate having an $SiO_2$ film with a thickness of 300 nm, baked for 60 seconds at 200° C. to form a bottom resist layer with a thickness of 300 nm.

Next, the intermediate resist layer composition (ArF Si-containing intermediate layer composition SOG) prepared above was applied over the bottom resist layer, and baked for 60 seconds at 200° C., to form an intermediate resist layer with a thickness of 90 nm.

Next, the solution of the top resist layer composition (ArF SL resist) prepared above was applied over the intermediate resist layer, and baked for 60 seconds at 110° C., to form a top resist layer with a thickness of 160 nm.

Thus a trilayer resist film was formed.

Subsequently, pattern circuit areas of the top resist layer were exposed by an ArF exposure system (S307E, NA0.85, σ0.93, 2/3 annular illumination, a Cr mask, manufactured by Nikon Corporation), baked (PEB) for 60 seconds at 110° C., and developed in 2.38% by mass aqueous solution of tetramethylammonium hydroxide (TMAH) for 60 seconds, to obtain a positive resist pattern. The results of observation of the pattern profile of 80 nm Line and Space are shown in the following Table 6.

Next, the resist pattern obtained by the ArF exposure and development was transferred to the intermediate resist layer (SOG film) under the following conditions. Etching conditions (3) are as follows.

Chamber pressure: 40.0 Pa

RF power: 1,000 w

Gap: 9 mm $CHF_3$ gas flow rate: 20 ml/min $CF_4$ gas flow rate: 60 ml/min

Ar gas flow rate: 200 ml/min

Time: 30 sec

Next, the pattern transferred to the intermediate resist layer (SOG film) was transferred to the bottom resist layer by etching with a gas mainly containing oxygen gas. Etching conditions (4) are as follows.

Chamber pressure: 450 mTorr (60 Pa)

RF power: 600 W $N_2$ gas flow rate: 60 sccm $O_2$ gas flow rate: 10 sccm

Gap: 9 mm

Time: 20 sec

Then, the $SiO_2$ substrate was processed under the etching conditions (1) by using the pattern on the bottom resist layer as a mask.

Each pattern profile was observed with an electron microscope (S-4700) manufactured by Hitachi Ltd. These profiles were compared to each other. The results are shown in Table 6.

TABLE 6

| | bottom resist layer composition | intermediate resist layer composition | top resist layer composition | pattern profile after development | pattern profile transferred to SOG | pattern profile transferred to bottom layer | pattern profile after etching of substrate |
|---|---|---|---|---|---|---|---|
| Example 1 | | ArF Si-containing intermediate layer composition | ArF SL resist | vertical profile | vertical profile | vertical profile | vertical profile |
| Example 2 | | ArF Si-containing intermediate layer composition | ArF SL resist | vertical profile | vertical profile | vertical profile | vertical profile |
| Example 3 | | ArF Si-containing intermediate layer composition | ArF SL resist | vertical profile | vertical profile | vertical profile | vertical profile |
| Example 4 | | ArF Si-containing intermediate layer composition | ArF SL resist | vertical profile | vertical profile | vertical profile | vertical profile |
| Example 5 | | ArF Si-containing intermediate layer composition | ArF SL resist | vertical profile | vertical profile | vertical profile | vertical profile |
| Example 6 | | ArF Si-containing intermediate layer composition | ArF SL resist | vertical profile | vertical profile | vertical profile | vertical profile |
| Example 7 | | ArF Si-containing intermediate layer composition | ArF SL resist | vertical profile | vertical profile | vertical profile | vertical profile |
| Example 8 | | ArF Si-containing intermediate layer composition | ArF SL resist | vertical profile | vertical profile | vertical profile | vertical profile |
| Example 9 | | ArF Si-containing intermediate layer composition | ArF SL resist | vertical profile | vertical profile | vertical profile | vertical profile |
| Example 10 | | ArF Si-containing intermediate layer composition | ArF SL resist | vertical profile | vertical profile | vertical profile | vertical profile |
| Example 11 | | ArF Si-containing intermediate layer composition | ArF SL resist | vertical profile | vertical profile | vertical profile | vertical profile |
| Example 12 | | ArF Si-containing intermediate layer composition | ArF SL resist | vertical profile | vertical profile | vertical profile | vertical profile |
| Example 13 | | ArF Si-containing intermediate layer composition | ArF SL resist | vertical profile | vertical profile | vertical profile | vertical profile |
| Example 14 | | ArF Si-containing intermediate layer composition | ArF SL resist | vertical profile | vertical profile | vertical profile | vertical profile |
| Example 15 | | ArF Si-containing intermediate layer composition | ArF SL resist | vertical profile | vertical profile | vertical profile | vertical profile |
| Example 16 | | ArF Si-containing intermediate layer composition | ArF SL resist | vertical profile | vertical profile | vertical profile | vertical profile |
| Comparative Example 1 | | ArF Si-containing intermediate layer composition | ArF SL resist | vertical profile | vertical profile | vertical profile | taper profile and film loss |
| Comparative Example 2 | | ArF Si-containing intermediate layer composition | ArF SL resist | vertical profile | vertical profile | vertical profile | taper profile and film loss |

As shown in Table 6, it has been confirmed that the resist pattern profiles after development, pattern profiles of the bottom resist layers after oxygen etching and after etching for processing substrates are good in Examples 1 to 16. That is, it has been established that use of the bottom resist layer composition according to the present invention makes it possible to pattern substrates with extreme accuracy.

The present invention is not limited to the above-described embodiment. The above-described embodiment is a mere example, and those having the substantially same structure as that described in the appended claims and providing the similar action and effects are included in the scope of the present invention.

What is claimed is:
1. A bottom resist layer composition for a multilayer-resist film used in lithography comprising, at least, a polymer comprising a repeating unit represented by the following general formula (1),

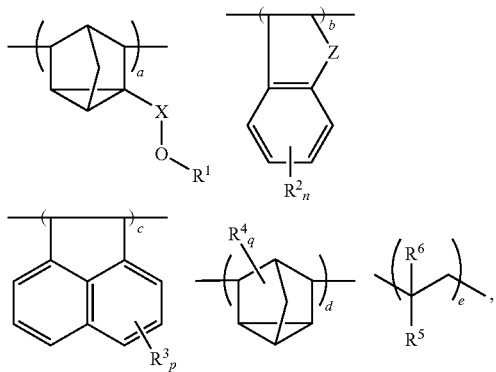

wherein R¹ represents a hydrogen atom or an acid labile group;

X represents any one of a single bond, —Y—C(=O)—, and a linear or branched alkylene group having 1-4 carbon atoms;

Y represents a single bond or a linear or branched alkylene group having 1-4 carbon atoms;

Z represents any one of a methylene group, an oxygen atom, and a sulfur atom;

R² and R³ independently represent an alkyl group, an alkoxy group, an acetoxy group or an alkoxycarbonyl group each having 1-4 carbon atoms, or an aryl group having 6-10 carbon atoms;

R⁴ represents an alkyl group having 1-4 carbon atoms or an aryl group having 6-10 carbon atoms;

R⁵ represents a pyrene, fluorene, phenanthrene, chrysene, naphthacene, pentacene, or acenaphthene in which hydrogen atoms in part or in entirety may optionally be substituted with a halogen;

n represents an integer of 0 to 4;

p and q independently represent an integer of 0 to 6;

R⁶ represents a hydrogen atom or a methyl group; and a, b, c, d, and e satisfy 0<a<1.0, 0≦b≦0.9, 0≦c≦0.9, 0≦d≦0.9, 0≦e≦0.9, and 0<b+c+d+e<1.0.

2. The bottom resist layer composition according to claim 1, further comprising any one or more of an organic solvent, an acid generator, and a crosslinker.

3. A patterning process for patterning a substrate by lithography wherein, at least, a bottom resist layer is formed on a substrate with the bottom resist layer composition according to claim 2; a top resist layer is formed on the bottom resist layer with a top resist layer composition of a photoresist composition, to form a bilayer resist film; a pattern circuit area of the top resist layer is exposed and then developed with a developer to form a resist pattern on the top resist layer; the bottom resist layer is etched using as a mask the top resist layer on which the pattern is formed; and then the substrate is etched using as a mask at least the bottom resist layer on which the pattern is formed, to form the pattern on the substrate.

4. The patterning process according to claim 3, wherein the top resist layer composition of a photoresist composition comprises a polymer containing silicon atoms, and the etching of the bottom resist layer using the top resist layer as a mask is carried out by using an etching gas mainly containing oxygen gas or hydrogen gas.

5. A patterning process for patterning a substrate by lithography wherein, at least, a bottom resist layer is formed on a substrate with the bottom resist layer composition according to claim 2; an intermediate resist layer is formed on the bottom resist layer by using an intermediate resist layer composition containing silicon atoms; a top resist layer is formed on the intermediate resist layer by using a top resist layer composition of a photoresist composition, to form a trilayer resist film; a pattern circuit area of the top resist layer is exposed and then developed with a developer to form a resist pattern on the top resist layer; the intermediate resist layer is etched using as a mask the top resist layer on which the pattern is formed; the bottom resist layer is etched using as a mask at least the intermediate resist layer on which the pattern is formed; and then the substrate is etched using as a mask at least the bottom resist layer on which the pattern is formed, to form the pattern on the substrate.

6. The patterning process according to claim 5, wherein the top resist layer composition of a photoresist composition comprises a polymer without a silicon atom, and the etching of the bottom resist layer using the intermediate resist layer as a mask is carried out by using an etching gas mainly containing oxygen gas or hydrogen gas.

7. A patterning process for patterning a substrate by lithography wherein, at least, a bottom resist layer is formed on a substrate with the bottom resist layer composition according to claim 1; a top resist layer is formed on the bottom resist layer with a top resist layer composition of a photoresist composition, to form a bilayer resist film; a pattern circuit area of the top resist layer is exposed and then developed with a developer to form a resist pattern on the top resist layer; the bottom resist layer is etched using as a mask the top resist layer on which the pattern is formed; and then the substrate is etched using as a mask at least the bottom resist layer on which the pattern is formed, to form the pattern on the substrate.

8. The patterning process according to claim 7, wherein the top resist layer composition of a photoresist composition comprises a polymer containing silicon atoms, and the etching of the bottom resist layer using the top resist layer as a mask is carried out by using an etching gas mainly containing oxygen gas or hydrogen gas.

9. A patterning process for patterning a substrate by lithography wherein, at least, a bottom resist layer is formed on a substrate with the bottom resist layer composition according to claim 1; an intermediate resist layer is formed on the bottom resist layer by using an intermediate resist layer composition containing silicon atoms; a top resist layer is formed on the intermediate resist layer by using a top resist layer composition of a photoresist composition, to form a trilayer resist film; a pattern circuit area of the top resist layer is exposed and then developed with a developer to form a resist pattern on the top resist layer; the intermediate resist layer is etched using as a mask the top resist layer on which the pattern is formed; the bottom resist layer is etched using as a mask at least the intermediate resist layer on which the pattern is formed; and then the substrate is etched using as a mask at least the bottom resist layer on which the pattern is formed, to form the pattern on the substrate.

10. The patterning process according to claim 9, wherein the top resist layer composition of a photoresist composition comprises a polymer without a silicon atom, and the etching of the bottom resist layer using the intermediate resist layer as a mask is carried out by using an etching gas mainly containing oxygen gas or hydrogen gas.

* * * * *